United States Patent
Mishima et al.

(10) Patent No.: US 6,815,001 B1
(45) Date of Patent: Nov. 9, 2004

(54) ELECTRONIC DEVICE, METHOD FOR PRODUCING ELECTRON SOURCE AND IMAGE FORMING DEVICE, AND APPARATUS FOR PRODUCING ELECTRONIC DEVICE

(75) Inventors: Seiji Mishima, Zama (JP); Toshifumi Yoshioka, Hiratsuka (JP); Mitsutoshi Hasegawa, Yokohama (JP); Kazuhiro Sando, Atsugi (JP); Kazuya Shigeoka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/647,953

(22) PCT Filed: Feb. 7, 2000

(86) PCT No.: PCT/JP00/00643

§ 371 (c)(1),
(2), (4) Date: Dec. 11, 2000

(87) PCT Pub. No.: WO00/45964

PCT Pub. Date: Aug. 10, 2000

(30) Foreign Application Priority Data

Feb. 8, 1999 (JP) .......................................... 11-029760
Feb. 26, 1999 (JP) .......................................... 11-049360
Feb. 26, 1999 (JP) .......................................... 11-050191

(51) Int. Cl.[7] ................................................. B05D 5/12
(52) U.S. Cl. .............................. 427/8; 427/10; 427/58; 427/77; 427/78; 427/287
(58) Field of Search .......................... 427/287, 58, 282, 427/8, 9, 10, 123, 125, 126.1, 77, 78

(56) References Cited

U.S. PATENT DOCUMENTS 5,023,110 A    6/1991  Nomura et al. ................ 427/49
5,066,883 A  * 11/1991  Yoshioka et al. ........... 313/309
5,473,424 A   12/1995  Okumura ................ 356/139.03
6,060,113 A  *  5/2000  Banno et al. .................. 427/78

FOREIGN PATENT DOCUMENTS

| EP | 0 717 428 A2 |   | 6/1996 |
| EP | 736890 | * | 10/1996 |
| EP | 1124247 | * | 8/2001 |
| JP | 64-31332 |   | 2/1989 |
| JP | 1-283749 |   | 11/1989 |

(List continued on next page.)

OTHER PUBLICATIONS

W.P. Dyke et al., "Field Emmission", Advances in Electronics and Electron Physics, vol. VIII, 1956, pp. 89–185.
H. Araki, et al., "Electroforming and Electron Emission of Carbon Thin Films", Journal of the Vacuum Soc. of Japan, vol. 2–6, No. 1, 1983, pp. 22–29 (with English Abstract on p. 22).
G. Dittmer, "Electrical Conduction and Electron Emission of Discontinuous Thin Films", Thin Solid Films. 9, 1972,pp. 317–328.

(List continued on next page.)

*Primary Examiner*—Brian K. Talbot
(74) *Attorney, Agent, or Firm*—Fitzpatrick, Cella, Harper & Scinto

(57) ABSTRACT

A method of manufacturing an electronic device including a step of giving a droplet 12 of a liquid containing a formation material of a member that constitutes the electronic device to a plurality of portions on a substrate 1 while said substrate 1 and a droplet ejecting portion 7 are moved relatively in an in-surface direction of said substrate 1, wherein the droplet 12 is given while a position on a droplet given surface to which the droplet is given is corrected in accordance with the distribution of distances between the ejecting portion 7 and the droplet 12 given surface on the substrate which occurs when the substrate 1 and the ejecting portion 7 are relatively moved. Thereby forming the member constituting the electronic device accurately at the plural portion on the substrate 1, and thus forming plural electronic device of same charactoristics.

18 Claims, 26 Drawing Sheets

FOREIGN PATENT DOCUMENTS

| | | | |
|---|---|---|---|
| JP | 2-56822 | | 2/1990 |
| JP | 2-257552 | | 10/1990 |
| JP | 163499 | * | 6/1994 |
| JP | 6-163499 | | 6/1994 |
| JP | 8-171850 | | 7/1996 |
| JP | 9-69334 | | 3/1997 |
| JP | 5654 | * | 1/1998 |
| JP | 10-5654 | | 1/1998 |
| JP | 58668 | * | 3/1998 |
| JP | 10-58668 | | 3/1998 |
| JP | 25852 | * | 1/1999 |
| JP | 11-25852 | | 1/1999 |

OTHER PUBLICATIONS

M. Elinson, et al. "The Emission of Hot Electrons and the Field Emissions of Electrons From Tin Oxide", Radio Engineering and Electronic Physics, Jul. 1965, pp. 1290–1298.

C.A. Mead, "Operation of Tunnel–Emission Devices, " J. Applied Physics, vol. 32, No. 4, Apr. 1961, pp. 646–652.

C.A. Spindt et al., "Physical Properties of Thin–film Field Emission Cathodes with Molybdenum Cases", J. Applied Physics, vol. 47, No. 12; Dec. 1976, pp. 5248–5263.

M. Hartwell et al., "Strong Electron Emmission From Patterned Tin–Indium Oxide Films", IEDM, 1975, pp. 519–521.

* cited by examiner (a)

(b)

(a)

(b)

(a)

(b)

(a)

(b)

(a)

(b)

(a)

(b)

(a)

(b)

(c)

(a)

(b)

(c)

ELECTRONIC DEVICE, METHOD FOR
PRODUCING ELECTRON SOURCE AND
IMAGE FORMING DEVICE, AND
APPARATUS FOR PRODUCING
ELECTRONIC DEVICE

This application is a National Stage filing under 35 U.S.C. § 371 of International Application No. PCT/JP00/00643, filed Feb. 7, 2000, published in Japanese (not English) as International Publication Number WO 00/45964 on Aug. 10, 2000, which claims the benefit of Japanese Patent Application Nos. 11-29760/1999, filed Feb. 8, 1999, 11-49360/1999, filed Feb. 26, 1999, and 11-50191/1999, filed Feb. 26, 1999.

TECHNICAL FIELD

The present invention relates to a method of manufacturing an electronic device and a device for manufacturing the same, and more particularly to a method of manufacturing an electronic device manufactured through a process of giving a droplet of a liquid including a formation material of a member that constitutes the electronic device onto a substrate and a device for manufacturing the electronic device.

BACKGROUND ART

Up to now, known electron emission elements are roughly classified into two kinds of a thermionic electron emission element and a cold cathode electron emission element. The cold cathode electron emission element includes a field emission type (hereinafter referred to as "FE type"), a metal/insulating layer/metal type (hereinafter referred to as "MIM type"), a surface conduction type electron emission element, etc.

Examples of the FE type have been disclosed in "Field Emission" of Advance in Electron Physics, 8,89 (1956) by W. P. Dyke and W. W. Dolan, "Physical Properties of thin-film field emission cathodes with molybdenum cones" of J. Appl. Phys., 47,5248 (1976), by C. A. Spindt, etc.

Examples of the MIM type have been disclosed in "Operation of Tunnel-Emission Devices" of J. Appl., Phys., 32,646(1961), by C. A. Mead, etc.

Examples of the surface conduction type electron emission element have been disclosed in Radio Eng. Electron Phys., 10, 1290(1965) by M. I. Elinson, etc.

The surface conduction type electron emission element utilizes a phenomenon in which electron emission occurs by allowing a current to flow into a small-area thin film formed on an insulating substrate in parallel to a film surface.

As the surface conduction type electron emission element, there have been reported a surface conduction type electron emission element using an $SnO_2$ thin film by M. I. Elinson, etc., a surface conduction type electron emission element using an Au thin film [G. Dittmer: "Thin Solid Films", 9,317 (1972)], a surface conduction type electron emission element using an $In_2O_3/SnO_2$ thin film [M. Hartwell and C. G. Fonstad: "IEEE Trans. ED Conf.", 519(1975)], a surface conduction type electron emission element using a carbon thin film ["Vapor Vacuum" of Volume 26, No. 1, p 22 (1983), by Hisashi Araki, et al.], etc.

As a typical example of those surface conduction type electron emission elements, the structure of the above-mentioned element by M. Hartwell is schematically shown in FIG. 25. In the figure, reference numeral 2001 denotes a substrate. Reference numeral 2004 denotes an electrically conductive film that is formed of a metal oxide thin film formed in an H-shaped pattern, etc., where there is formed an electron emission portion 2005 through an electrifying process called "electrification forming" which will be described later. In the figure, an interval L between the element electrodes is set to 0.5 to 1 mm, and W' is set to 0.1 mm.

In those surface conduction type electron emission elements, it is general that the electron emission portion 2005 is formed on the electrically conductive film 2004 through the electrifying process which is called "electrification forming" before the electron emission is conducted. In other words, the electrification forming is a process in which a voltage is applied to both ends of the electrically conductive film 2004 so that the electrically conductive film 2004 is electrified, to thereby locally destroy, deform or affect the electrically conductive film 2004 to change the structure, thus forming the electron emission portion 2005 which is in an electrically high-resistant state. A fissure occurs in a part of the electrically conductive film 2004 on the electron emission portion 2005, and electrons are emitted from a portion close to the fissure.

The above surface conduction type electron emission element is advantageous in that a large number of elements can be arranged over a large area, because the structure is simple. Accordingly, various applications for making the best use of that advantage have been researched. For example, the surface conduction type electron emission element is applied to a charge beam source or an image forming apparatus such as a display device.

Up to now, as an example in which a large number of surface conduction type electron emission elements are arranged, there is an electron source in which the surface conduction type electron emission elements are arranged in parallel with each other, and a large number of lines obtained by connecting both ends (both of element electrodes) of the respective surface conduction type electron emission elements to each other by wirings (also called "common wirings"), respectively, are arranged (also called "ladder-type arrangement") (for example, Japanese Patent Application Laid-open No. 64-31332, Japanese Patent Application Laid-open No. 1-283749 and Japanese Patent Application Laid-open No. 2-257552).

Also, in particular, in the display device, a plate-type display device similarly to the display device using the liquid crystal can be provided, and there has been proposed a display device that combines an electron source in which a large number of surface conduction type electron emission elements are arranged with a fluorescent material that emits a visible light with being irradiated with an electron ray from the electron source (U.S. Pat. No. 5,066,883).

Also, FIG. 26 is a perspective view showing the structure of an electron emission element disclosed in Japanese Patent Application Laid-open No. 2-56822. In the figure, reference numeral 3001 denote a substrate; 3002 and 3003, element electrodes; 3004, an electrically conductive film; and 3005, an electron emission portion. There have been proposed various methods of manufacturing the electron emission element. For example, the element electrodes 3002 and 3003 are formed on the substrate 3001 through a general vacuum evaporation technique or a photolithgraphy technique. Then, the electrically conductive film 3004 is formed through a dispersion coating method. Thereafter, a voltage is applied to the element electrodes 3002 and 3003 to conduct an electrifying process, thereby forming the electron emission portion 3005.

However, the conventional method of manufacturing the electron emission element suffers from such defects that the number of processes are large, it is difficult to form the electron emission elements on the large area through the existing technique, a special and expensive manufacturing device is required and the production costs are high, because the semiconductor process is mainly conducted in the conventional method.

Under the above circumstances, the present applicants have studied an electron source substrate obtained in such a manner that a solution containing a metal is ejected onto a substrate in the state of a droplet to form element electrodes and element films, and the elements are arranged on an insulating substrate in matrix.

For example, Japanese Patent Application Laid-open No. 8-171850 discloses a method of manufacturing the element electrode and the element film using an ink jet method, and also Japanese Patent Application Laid-open No. 9-069334 and EP-A-0717428 disclose a method in which a liquid droplet is supplied onto a substrate disposed on a stage through an ink jet method while the stage is scanned, to thereby form the element film.

On the other hand, as an example in which an electronic device other than the electron emission element and the electron source is manufactured through the ink jet method, there has been disclosed a method of manufacturing a color filter by using the ink jet method in Japanese Patent Application Laid-open No. 8-327816.

However, in the method of manufacturing the above-described electron emission element by using the ink jet method and the manufacturing device thereof, since there is provided no correcting mechanism for correcting a position to which a droplet is given in accordance with the deformation of the substrate (distortion and unevenness of the thickness of the substrate) accompanied by the large-sized electron source substrate, it is difficult to improve the yield in manufacturing the large-area electron source substrate and the image forming apparatus using that substrate, thereby resulting in the high production costs.

Also, not only in the manufacture of the electron emission element or the like, but also in the manufacture using the above-described ink jet method of the color filter, since there is provided no correcting mechanism for correcting a position to which a droplet is given in accordance with the deformation of the substrate (distortion and unevenness of the thickness of the substrate) accompanied by the large-sized electron source substrate, it is difficult to improve the yield in manufacturing, thereby resulting in the high production costs.

An object of the present invention is to provide a manufacturing method and a manufacturing device which are capable of forming a member that constitutes an electronic device on desired plural portions of a substrate with a high accuracy.

Also, another object of the present invention is to provide a manufacturing method and a manufacturing device which are capable of forming electronic devices on a plurality of substrates with a high reproducibility.

Further, still another object of the present invention is to provide a manufacturing method and a manufacturing device which are capable of forming a plurality of electronic devices uniform in characteristic on a substrate.

Further, yet still another object of the present invention is to provide a manufacturing method and a manufacturing device which are capable of manufacturing an electron source having a plurality of electron emission elements uniform in electron emission characteristic.

Further, yet still another object of the present invention is to provide a manufacturing method and a manufacturing device which are capable of easily manufacturing an electronic device having a uniform characteristic at low costs.

DISCLOSURE OF THE INVENTION

In order to achieve the above objects, the present invention is structured as follows:

According to the present invention, there is provided a method of manufacturing an electronic device including a step of giving a droplet of a liquid containing a formation material of a member that constitutes the electronic device to a plurality of portions on a substrate while the substrate and a droplet ejecting portion are moved relatively in an in-surface direction of the substrate, characterized in that the droplet is given while a position on a droplet given surface to which the droplet is given is corrected in accordance with the distribution of distances between the ejecting portion and the droplet given surface on the substrate which occurs when the substrate and the ejecting portion are relatively moved.

Also, according to the present invention, there is provided a method of manufacturing an electron source having a plurality of electron emission elements, characterized in that there is provided a step of giving a droplet of a liquid containing a formation material of an electrically conductive member that constitutes the electron emission element to a plurality of portions on a substrate while the substrate and a droplet ejecting portion are moved relatively in an in-surface direction of the substrate, and in that the droplet is given while a position on a droplet given surface to which the droplet is given is corrected in accordance with the distribution of distances between the ejecting portion and the droplet given surface on the substrate which occurs when the substrate and the ejecting portion are relatively moved.

Further, according to the present invention, there is provided a method of manufacturing an electron source having a plurality of electron emission elements with an electrically conductive film having an electron emission portion between a pair of electrodes, characterized in that the formation of the electrically conductive film includes a step of giving a droplet of a liquid containing a formation material of the electrically conductive film to a plurality of portions on a substrate while the substrate and a droplet ejecting portion are moved relatively in an in-surface direction of the substrate, and in that the droplet is given while a position on a droplet given surface to which the droplet is given is corrected in accordance with the distribution of distances between the ejecting portion and the droplet given surface on the substrate which occurs when the substrate and the ejecting portion are relatively moved.

Still further, according to the present invention, there is provided a method of manufacturing an electron source having a plurality of electron emission elements with an electrically conductive film having an electron emission portion between a pair of electrodes, characterized in that the formation of the pair of electrodes and the electrically conductive film includes a step of giving the respective droplets of a liquid containing a formation material of the pair of electrodes and a liquid containing a formation material of the electrically conductive film to a plurality of portions on a substrate while the substrate and a droplet ejecting portion are moved relatively in an in-surface direction of the substrate, and in that the droplets are given while a position on a droplet given surface to which the droplets are given is corrected in accordance with the distribution of distances between the ejecting portion and the droplet given surface on the substrate which occurs when the substrate and the ejecting portion are relatively moved.

Yet still further, according to the present invention, there is provided a method of manufacturing an electron device or electron source in which the droplets are given while a distance between the ejecting portion and the droplet given surface on the substrate is detected, and a position on the droplet given surface to which the droplet is given is corrected on the basis of the detection result.

Also, the above-described manufacturing method according to the present invention includes:

that the detection of the distance includes a step of measuring the distances between the ejecting portion and all of the droplet given portions within the droplet given surface;

that the detection of the distance includes a step of measuring a distance between the ejecting portion and a specific portion of the droplet given surface; or that the detection of the distance includes a step of measuring a distance between the ejecting portion and a specific portion of the droplet given surface, and a step of calculating the distances between the ejecting portion and all of the droplet given portions within the droplet given surface on the basis of the measurement result.

Also, the above-described manufacturing method according to the present invention includes:

that the correction of the position to which the droplet is given is made by maintaining the distance between the ejecting portion and the droplet given surface on the substrate constant;

that the correction of the position to which the droplet is given is made by changing a timing at which the droplet is ejected from the ejecting portion in accordance with the distribution of the distances between the ejecting portion and the droplet given surface on the substrate; or that the correction of the position to which the droplet is given is made by changing an inclination of the substrate in accordance with the distribution of the distances between the ejecting portion and the droplet given surface on the substrate.

Yet still further, according to the present invention, there is provided a method of manufacturing an electronic device including a step of giving a droplet of a liquid containing a formation material of a member that constitutes the electronic device to a plurality of portions on a substrate while the substrate and a droplet ejecting portion are moved relatively in an in-surface direction of the substrate, characterized in that the droplet is given while a droplet given position on the substrate surface is corrected in accordance with the distribution of thicknesses of the substrate.

Yet still further, according to the present invention, there is provided a method of manufacturing an electron source having a plurality of electron emission elements, characterized in that there is provided a step of giving a droplet of a liquid containing a formation material of an electrically conductive member that constitutes the electron emission element to a plurality of portions on a substrate while the substrate and a droplet ejecting portion are moved relatively in an in-surface direction of the substrate, and in that the droplet is given while a position on a substrate surface to which the droplet is given is corrected in accordance with the distribution of a thickness of the substrate.

Yet still further, according to the present invention, there is provided a method of manufacturing an electron source having a plurality of electron emission elements with an electrically conductive film having an electron emission portion between a pair of electrodes, characterized in that the formation of the electrically conductive film includes a step of giving a droplet of a liquid containing a formation material of the electrically conductive film to a plurality of portions on a substrate while the substrate and a droplet ejecting portion are moved relatively in an in-surface direction of the substrate, and in that the droplet is given while a position on the substrate surface to which the droplet is given is corrected in accordance with the distribution of thicknesses of the substrate.

Yet still further, according to the present invention, there is provided a method of manufacturing an electron source having a plurality of electron emission elements with an electrically conductive film having an electron emission portion between a pair of electrodes, characterized in that the formation of the pair of electrodes and the electrically conductive film includes a step of giving the respective droplets of a liquid containing a formation material of the pair of electrodes and a liquid containing a formation material of the electrically conductive film to a plurality of portions on a substrate while the substrate and a droplet ejecting portion are moved relatively in an in-surface direction of the substrate, and in that the droplets are given while a position on a droplet given surface to which the droplets are given is corrected in accordance with the,distribution of thicknesses of the substrate.

Yet still further, according to the present invention, there is provided a method of manufacturing an electronic device or an electron source having a plurality of electron emission elements characterized in that the droplet is given while the thickness of the substrate is detected, and a droplet given position on the substrate surface is corrected on the basis of the detection result.

Also, the above-described manufacturing method according to the present invention includes:

that the detection of the thickness includes a step of measuring the thicknesses of all of the droplet given portions on the substrate surface;

that the detection of the thickness includes a step of measuring a thickness of a specific portion on the substrate surface; or that the detection of the thickness includes a step of measuring a thickness of a specific portion on the substrate surface, and a step of calculating the thicknesses of all of the droplet given portions on the substrate surface on the basis of the measurement result.

Also, the above-described manufacturing method according to the present invention includes:

that the droplet given position is corrected by maintaining the distance between the ejecting portion and the droplet given surface on the substrate constant;

that the correction of the position to which the droplet is given is made by changing a timing at which the droplet is ejected from the ejecting portion in accordance with the distribution of the thickness of the substrate; or that the correction of the position to which the droplet is given is made by changing an inclination of the substrate in accordance with the distribution of the thickness of the substrate.

Also, the above-described any manufacturing method according to the present invention includes:

that the droplet is given through an ink jet method;

that the ink jet method is of a system of giving a thermal energy to the liquid to produce a bubble, to thereby eject the droplet;

that the ink jet method is of a system of ejecting the droplet by a piezo-electric element;

that the electron source is an electron source including a plurality of electron emission element columns each having a plurality of electron emission elements connected between a pair of wirings; or that the electron source is an electron source in which a plurality of electron emission elements are arranged in matrix by a plurality of row wirings and a plurality of column wirings.

Yet still further, according to the present invention, there is provided a method of manufacturing an image forming apparatus having an electron source and an image forming member onto which electrons are irradiated from the electron source, characterized in that the electron source is manufactured by any one of the above-described methods of manufacturing the electron source.

Yet still further, according to the present invention, there is provided a device of manufacturing an electronic device, characterized by comprising: an ejecting portion which ejects a droplet of a liquid containing a formation material of a member that constitutes the electronic device; means for relatively moving a substrate on which the electronic device is formed and the ejecting portion in an in-surface direction of the substrate; means for detecting a distance between the ejecting portion and a droplet given surface on the substrate; and means for controlling a position on the droplet given surface to which the droplet is given on the basis of the detection result.

Also, the above-described manufacturing device according to the present invention includes:

that the means for detecting the distance includes a mechanism for measuring the distances between the ejecting portion and all of the droplet given portions within the droplet given surface;

that the means for detecting the distance includes a mechanism for measuring a distance between the ejecting portion and a specific portion of the droplet given surface; or that the means for detecting the distance includes a mechanism for measuring a distance between the ejecting portion and a specific portion of the droplet given surface, and a mechanism for calculating the distances between the ejecting portion and all of the droplet given portions within the droplet given surface on the basis of the measurement result.

Also, the above-described manufacturing device according to the present invention includes:

that the means for controlling the position to which the droplet is given includes a mechanism for maintaining the distance between the ejecting portion and the droplet given surface on the substrate constant;

that the means for controlling the position to which the droplet is given includes a mechanism for controlling a timing at which the droplet is ejected from the ejecting portion; or that the means for controlling the position to which the droplet is given includes a mechanism for controlling an inclination of the substrate.

Yet still further, according to the present invention, there is provided a device of manufacturing an electronic device, characterized by comprising: an ejecting portion which ejects a droplet of a liquid containing a formation material of a member that constitutes the electronic device; means for relatively moving a substrate on which the electronic device is formed and the ejecting portion in an in-surface direction of the substrate; means for detecting a thickness of the substrate; and means for controlling a position on the substrate surface to which the droplet is given on the basis of the detection result.

Also, the above-described manufacturing device according to the present invention includes:

that the means for detecting the thickness includes a mechanism for measuring the thicknesses of all of the droplet given portions on the substrate surface;

that the means for detecting the thickness includes a mechanism for measuring a thickness of a specific portion on the substrate surface; or that the means for detecting the thickness includes a mechanism for measuring a thickness of a specific portion on the substrate surface, and a mechanism for calculating the thicknesses of all of the droplet given portions on the substrate surface on the basis of the measurement result.

Also, the above-described manufacturing device according to the present invention includes:

that the means for controlling the droplet given position maintains the distance between the ejecting portion and the droplet given surface on the substrate constant;

that the means for controlling the position to which the droplet is given includes a mechanism for controlling a timing at which the droplet is ejected from the ejecting portion; or that the means for controlling the position to which the droplet is given includes a mechanism for controlling an inclination of the substrate.

Also, the above-described any manufacturing device according to the present invention includes:

that the ejecting portion comprises a nozzle of an ink jet device;

that the ink jet device is of a system of giving a thermal energy to the liquid to produce a bubble, to thereby eject the droplet;

that the ink jet device is of a system of ejecting the droplet by a piezo-electric element;

that the electronic device comprises an electron source including a plurality of electron emission elements;

that the electron source comprises an electron source including a plurality of electron emission element columns having a plurality of electron emission elements connected between a pair of wirings;

that the electron source comprises an electron source in which a plurality of electron emission elements are arranged in matrix by a plurality of row wirings and a plurality of column wirings; or that the electron emission element comprises an electron emission element including an electrically conductive film having an electron emission portion between a pair of electrodes.

The above-described electronic device according to the present invention includes, for example, a color filter of a liquid crystal display, a drive circuit of various displays such as a liquid crystal display, a plasma display or an electron ray display, an electron source per se, or the like. The structural member of the above electronic device manufactured by the manufacturing method and the manufacturing device according to the present invention is, particularly, a filter element in the above color filter, a drive electric conductor patterned on a circuit board or an insulator patterned on the circuit board for insulating between the drive electric conductors in the drive circuit for the above various displays, and an electric conductor that the structural member of a plurality of electron emission elements or the electron emission elements are connected to the drive wiring in the electron source, etc.

In the case where a droplet of a liquid containing a formation material of a member that constitutes the electronic device as described above is given to a plurality of portions on the substrate while the droplet ejecting portion and the substrate to which the droplet is given are relatively moved in an in-surface direction of the substrate, there is the distribution of the thickness of the substrate per se due to the unevenness of the thickness originally provided in the substrate or the distortion of the substrate which occurs in the manufacturing process until the droplet is given, or there is a case in which the flatness of a stage per se which holds the substrate when the droplet is given or the parallel degree of the ejecting portion and the substrate when the ejecting portion and the substrate are relatively moved is not constant. As a result, a distance between the substrate and the ejecting portion differs in each location on substrate (droplet given portion) to which the droplet is given, and the position to which the droplet is given (droplet given position) in fact is shifted from the above droplet given portion.

According to the manufacturing method of the present invention as described above, the droplet is given while the position on the droplet given surface to which the droplet is given is corrected in accordance with the distribution of the distances between the droplet ejecting portion and the droplet given surface on the substrate which occurs when the ejecting portion and the substrate are relatively moved in an in-surface direction of the substrate or while the position on the substrate surface to which the droplet is given is corrected in accordance with the distribution of the thickness of the substrate. As a result, the droplet can be given to a plurality of portions (droplet given portions) on the substrate to which the droplet is given with a high precision.

Also, in the manufacturing device according to the present invention, there are provided means for detecting a distance between the ejecting portion and a droplet given surface on the substrate, and means for controlling a position on the droplet given surface to which the droplet is given on the basis of the detection result; or means for detecting the thickness of the substrate, and means for controlling a position on the substrate surface to which the droplet is given on the basis of the detection result. As a result the above correction can be conducted, and the droplet can be given to a plurality of locations (droplet given portions) on the substrate to which the droplet is given with a high precision.

With the application of the above-described manufacturing method and manufacturing device according to the present invention, the color shift of the filter element can be prevented as much as possible in the above color filter, unnecessary shortcircuit between the drive electric conductors can be prevented as much as possible in the drive circuit of the above various displays, and the appearance of a defective electron emission element and non-uniformity of the characteristic can be prevented as much as possible in the electron source.

BEST MODE FOR CARRYING OUT THE INVENTION

Subsequently, preferred embodiments according to the present invention will be described.

First, a first embodiment will be described in detail below.

Figure 1:
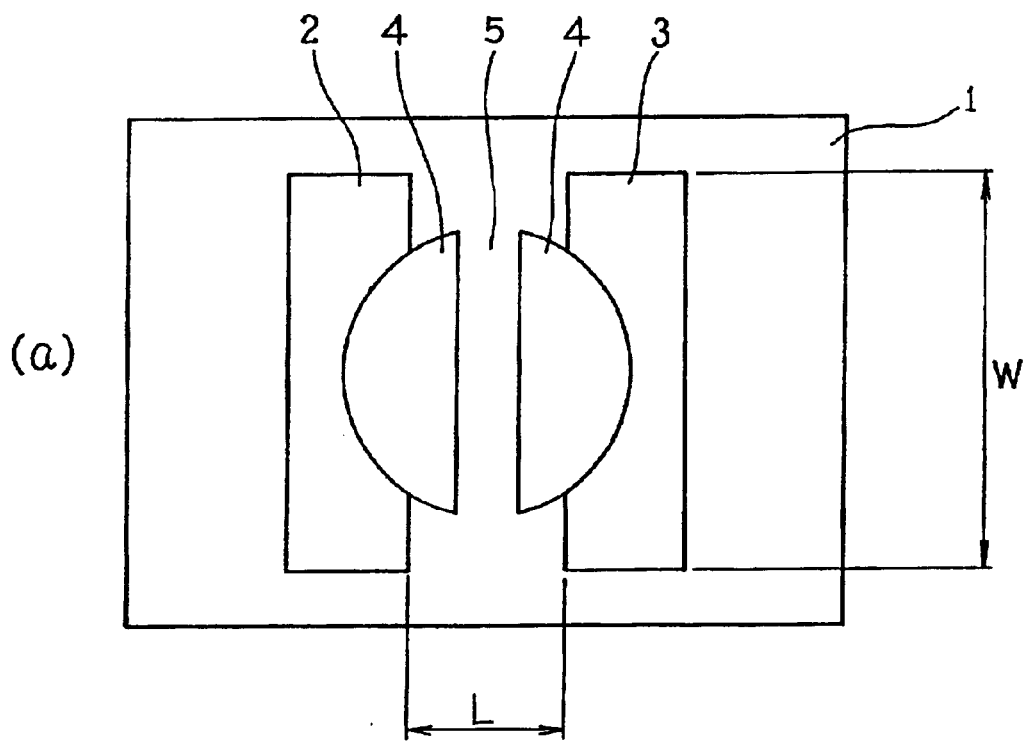
FIG. 1 is a schematic view showing one structural example of a surface conduction type electron emission element used in the present invention.
Figure 1:
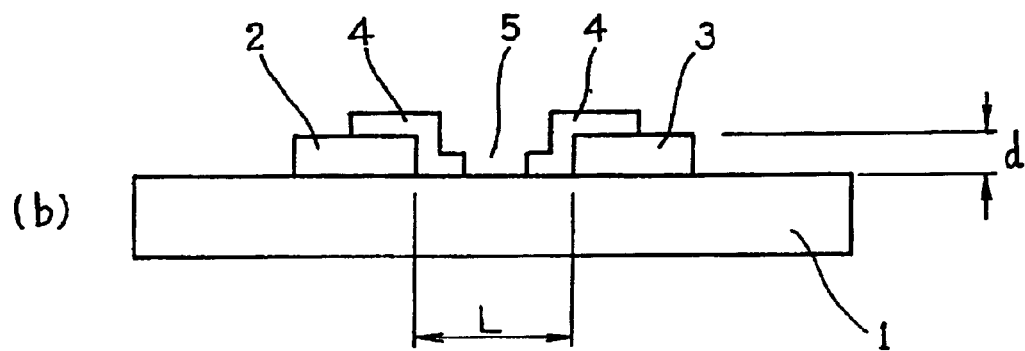

FIG. 1 is a schematic view showing one structural example of a surface conduction type electron emission element used in this embodiment, in which FIG. 1(a) is a plan view and FIG. 1(b) is a cross-sectional view. In FIG. 1, reference numeral 1 denotes a substrate, 2 and 3 are electrodes (element electrodes), 4 is a pair of electrically conductive films, and 5 is a gap between the pair of electrically conductive films.

The substrate 1 may be made of glass the impurity content of which is reduced such as a quartz glass or Na, a soda lime glass, a laminate obtained by laminating $SiO_2$ on the soda lime glass through a sputtering method or the like, ceramics such as alumina, an Si substrate or the like.

The material of the facing element electrodes 2 and 3 may be made of a general conductive material, and can be appropriately selected from, for example, a metal or an alloy of Ni, Cr, Au, Mo, W, Pt, Ti, Al, Cu or Pd, a metal such as Pd, Ag, Au, $RuO_2$, or Pd—Ag or a print conductor made up of metal oxide and glass or the like, a transparent conductor such as $In_2O_3$—$SnO_2$ and a semiconductor conductive material such as polysilicon.

The element electrode interval L, the element electrode length W, the configuration of the electrically conductive film 4, etc., are designed taking the applied shape into consideration. The element electrode interval L can be preferably set to a range of from several hundreds nm to several hundreds $\mu$m, and can be more preferably set to a range of from several $\mu$m to several tens $\mu$m taking a voltage applied between the element electrodes, etc., into consideration. The element electrode length W can be set to a range of from several $\mu$m to several hundreds $\mu$m taking a resistance of the electrode and the electron emission characteristic into consideration. The film thickness d of the element electrodes 2 and 3 can be set to a range of from several tens nm to several $\mu$m.

The material of the electrically conductive film 4 may be, for example, metal such as Pd, Pt, Ru, Ag, Au, Ti, In, Cu, Cr, Fe, Zn, Sn, Ta, W or Pb, oxide electric conductor such as PdO, $SnO_2$, $In_2O_3$, PbO or $Sb_2O_3$, boride such as $HfB_2$, $ZrB_2$, $LaB_6$, $CeB_6$, $YB_4$ or $GdB_4$, carbide such as TiC, ZrC, HfC, TaC, SiC or WC, nitride such as TiN, ZrN or HfN, semiconductor such as Si or Ge, carbon, etc.

The thickness of the electrically conductive film 4 is appropriately set taking a step coverage to the element electrodes 2 and 3, a resistance between the element electrodes 2 and 3, etc., into consideration, and is preferably set to a range of from several Å to several hundreds nm, and more preferably set to a range of from 1 nm to 50 nm. The resistance Rs is preferably set to a value of $10^2$ $\Omega$/square to $10^7$ $\Omega$/square.

Also, as a more preferable embodiment of the above electron emission element, as shown in FIGS. 2(a) and 2(b), there is an embodiment having a film 4a made of a carbon or carbon compound in the gap 5 or on the electrically conductive film 4, and the film made of carbon or carbon compound forms a gap 5a narrower than the gap 5, to thereby improve the lifetime and the electron emission efficiency.

Figure 3:
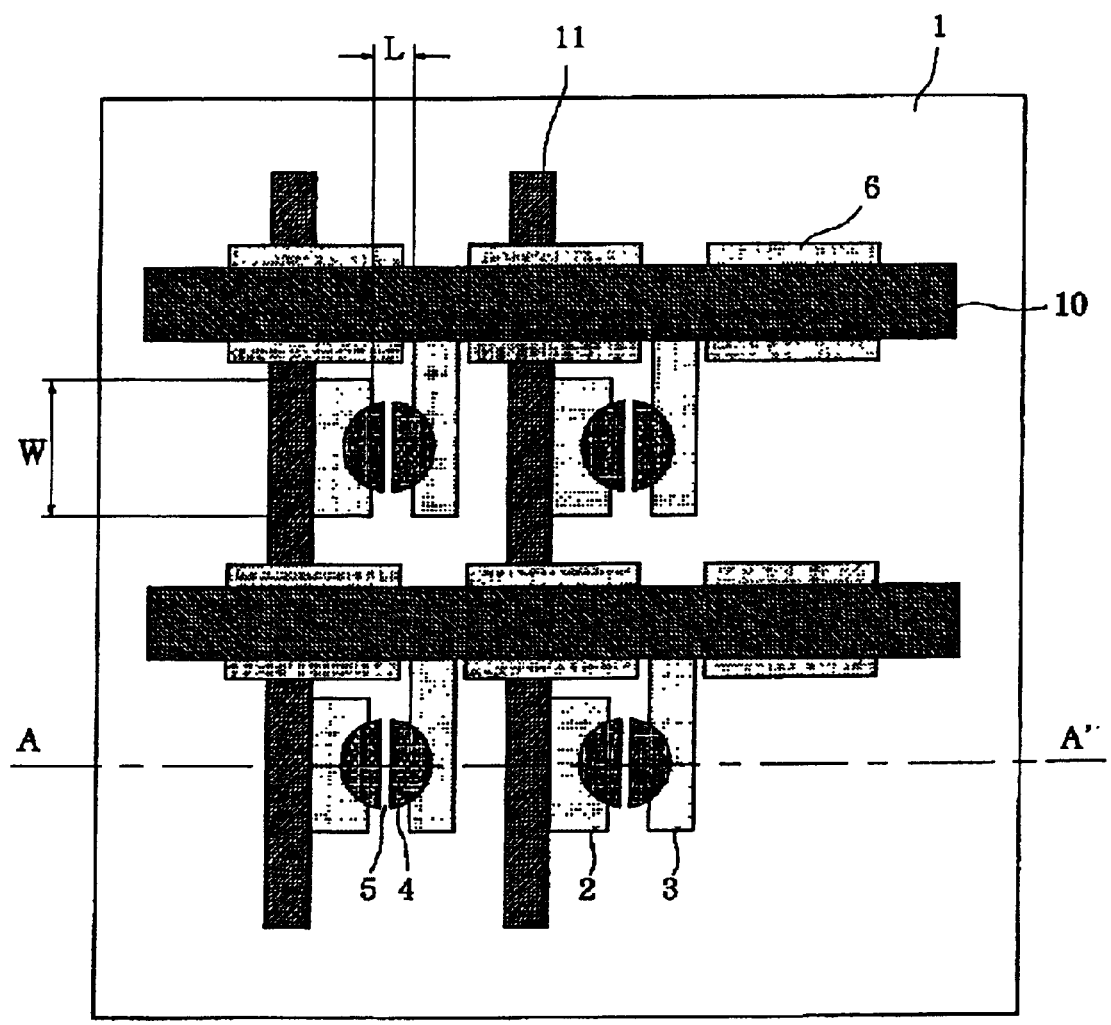
FIG. 3 is a schematic view showing one structural example of an electron source used in the present invention.
Figure 3:
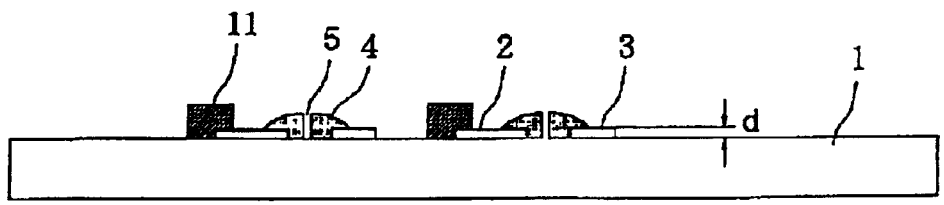

FIG. 3 shows an electron source manufactured through this embodiment and an electron source in which a plurality of electron emission elements described above are disposed on the substrate 1. In this example, reference numeral 11 denotes a column wiring, 10 is a row wiring, and 6 is an insulating layer. A plurality of electron emission elements described above are arranged in matrix by a plurality of row wirings 10 and a plurality of column wirings 11.

Hereinafter, a method of manufacturing the electron source in accordance with this embodiment as shown in FIG. 3 will be described.

1) First, the insulating substrate 1 is sufficiently cleaned by using a detergent, pure water, organic solvent, etc., and after an element electrode material is deposited through a vacuum evaporation method, sputtering method, etc., the element electrodes 2 and 3 are formed on the substrate 1, for example, through the photolithography technique.

2) Then, column wirings 11 connected with the element electrodes 2 and the row wirings 10 connected with the element electrodes 3 are sequentially formed through the insulating films 6.

3) Then, a solution containing a material that forms the above-described electrically conductive film 4 shown in FIG. 1 is given between the above-described respective element electrodes 2 and 3 by using a liquid droplet giving device and then heated, to thereby from the electrically conductive film 4.

Figure 4:
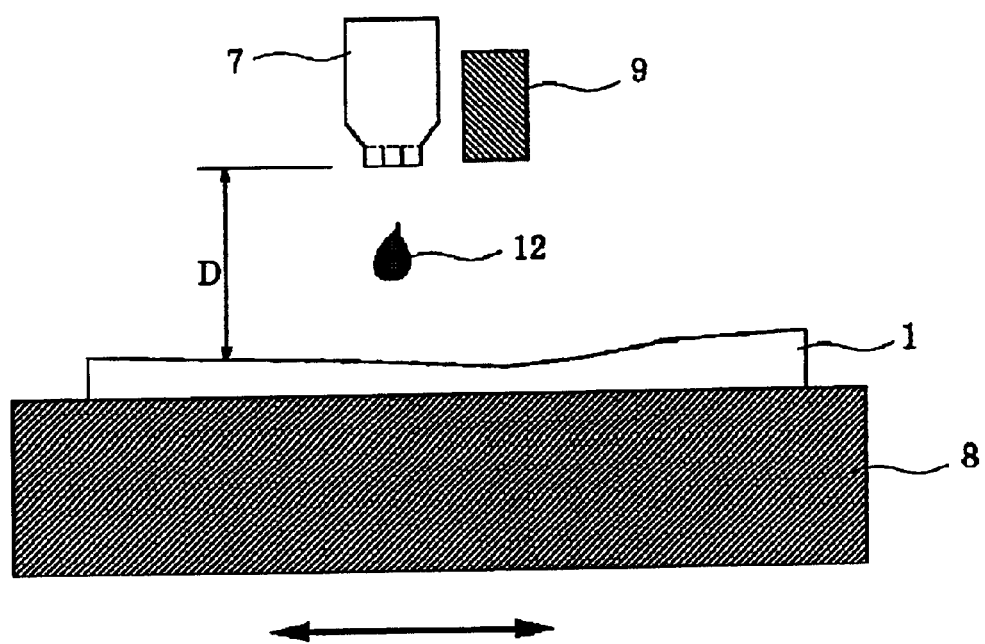
FIG. 4 is a schematic view showing a droplet giving device used in a first embodiment of the present invention.

FIG. 4 is a schematic view showing a liquid droplet giving device used in this embodiment.

As the liquid droplet giving device, any kind of devices may be employed if the device can form an arbitrary liquid droplet, but it is preferable to use an ink jet type device which is capable of controlling, particularly, in a range of from about ten several ng to several tens ng and readily forming a slight amount of droplet of about several tens ng or more. Also, as the ink jet system, any one of a so-called bubble jet system which gives a thermal energy to the liquid to generate a bubble to eject the liquid droplet, and a piezo-electric system that ejects a liquid droplet by a piezo-electric element can be applied.

The material of the liquid droplet may be in any state if the liquid droplet can be formed in that state, and may be for example, a solution in which the above-described metal or the like is dispersed or melted in water, a solvent or the like, an organic metal solvent, etc. For example, as examples that an element or compound of the electrically conductive film is palladium, there is aqueous solution containing ethanolamine complex such as palladium acetate-ethanolamine complex (PA-ME), palladium acetate-diethanol complex (PA-DE), palladium acetate-triethanolamine complex (PA-TE), palladium acetate-butyl ethanolamine complex (PA-BE), palladium acetate-dimethyl ethanolamine complex (PA-DME).

In FIG. 4, an ejecting head 7 is located above the substrate 1 on a substrate stage 8, and while the stage 8 (or ejecting head 7) is being moved, a metal contained solution is ejected in a liquid droplet state from an ejection nozzle disposed on the ejecting head, and a liquid droplet 12 is attached between the above respective element electrodes 2 and 3 on the substrate 1.

The moving speed of the stage 8 (or the head 7) is preferably set to about 1 mm/sec to 1000 mm/sec although it depends on a target tact, a substrate size, an ejection performance, etc. Also, a distance D between the ejection port and the substrate is set to about 10 $\mu$m to 2 mm, and generally to about 100 $\mu$m to 1000 $\mu$m from the precision of the device and the substrate thickness, etc., although it is found that the variation in a liquid attached position is more suppressed as the distance D is smaller.

The above liquid droplet 12 is given to a desired position between the respective element electrodes 2 and 3 from the ejection nozzle disposed on the ejecting head 7. The substrate 1 has the distribution of the thickness of the entire surface due to the thickness unevenness of the original substrate, the distortion during the manufacturing process, etc. Also, since the flatness of the stage 8 per se and the parallel degree when the stage 8 is moved are not kept constant, the distance between the ejection nozzle and the substrate 1 is changed depending on a location of the substrate with the results that the liquid droplet cannot be given to a position according to a designed value, and the yield is remarkably deteriorated.

Under the above circumstance, in the manufacturing method of this embodiment, in order to cope with the variation in the distance D between the ejection port of the ejection nozzle and the substrate, a distance measuring sensor 9 is disposed on a side of the ejecting head 7, and the ejection is corrected in accordance with information from that sensor 9.

As the correcting systems, there are (1) a system in which the head is vertically moved by using, for example, a piezo-electric element on the basis of the variation information of D during scanning, thereby keeping D constant to control the liquid attached position, (2) a system in which the liquid attached position is controlled by changing an ejection timing on the basis of the variation information of D, etc. In addition, there is (3) a system in which a tilting function is provided on a stage side to tilt the stage in accordance with the measured value of D. However, this system has a difficulty in the correction when the inclination is not one-dimensional.

Also, the measurement of the distance D between the ejection port and the substrate may be conducted immediately before ejection or at the same time of ejection, or only the measurement may be conducted in advance.

Referring to FIG. 4, reference numeral 12 denotes a liquid droplet. The speed of the liquid droplet 12 (ejection speed) is generally set to about several m/sec to several tens m/sec although it depends on the ejecting conditions, the liquid kind and viscosity, etc. For example, in the case where the ejection speed is 10 m/sec, the stage speed is 500 mm/sec and the variation of D is 100 μm, the liquid attached position is shifted by 5 μm through simple calculation.

Using the above-described liquid droplet giving device, the substrate fabricated in the above-described processes 1) to 3) is fixed onto stage 8 of the above-described liquid droplet giving device, and the distance D between the ejection port and the substrate is measured over the entire surface of the substrate by using the distance measuring sensor 9. In addition, while the liquid attached position on the substrate 1 is corrected on the basis of the measured data, the liquid droplet 12 of a solution containing a material that forms the electrically conductive film 4 is given and then burned at 300 to 400° C., to thereby form the electrically conductive film 4 between the above-described respective element electrodes 2 and 3.

4) Then, an electrifying process called "forming" is conducted. When electrification is conducted between the respective element electrodes 2 and 3, the gap 5 such as a fissure is formed in the respective electrically conductive films 4 as shown in FIG. 3.

Figure 5:
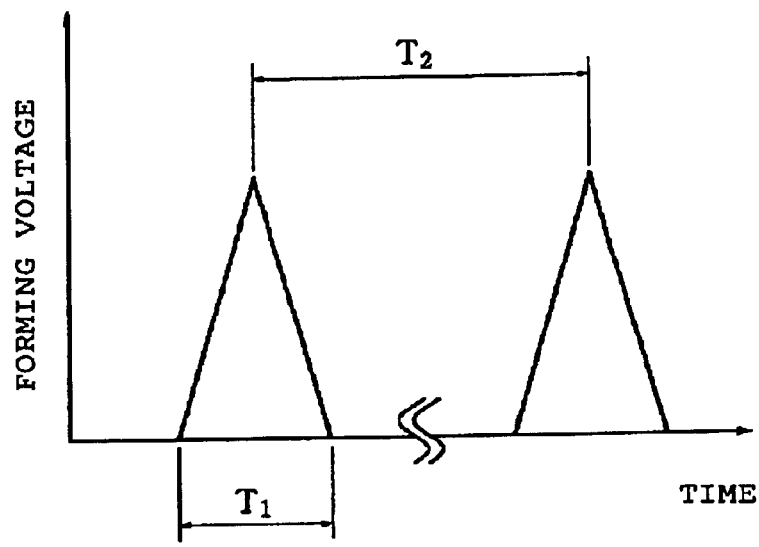
FIG. 5 is a schematic view showing an example of a voltage waveform of an electrification forming.
Figure 5:
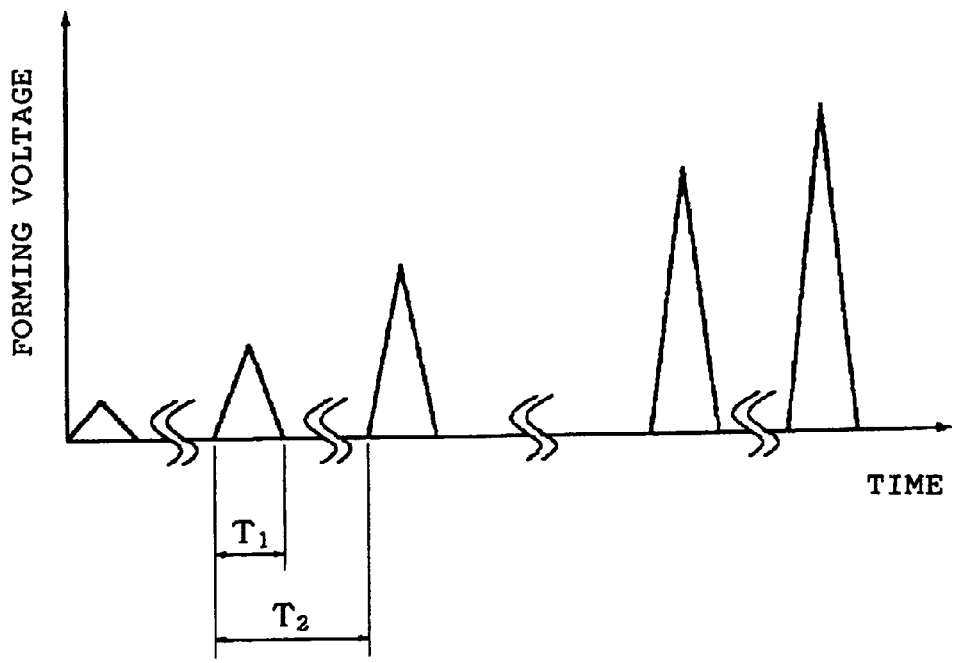

An example of the voltage waveform of the electrification forming is shown in FIG. 5.

The voltage waveform is particularly preferably a pulse waveform. There are a manner shown in FIG. 5(a) in which pulses with a pulse wave peak value as a constant voltage are continuously applied, and a manner shown in FIG. 5(b) in which pulses are applied while the pulse wave peak value increases.

First, a case in which the pulse wave peak value is a constant voltage will be described with reference to FIG. 5(a). $T_1$ and $T_2$ in FIG. 5(a) are a pulse width and a pulse interval of the voltage waveform. The peak value (peak voltage) of a chopping wave is appropriately selected in accordance with the formation of the electron emission element. Under the above conditions, for example, a voltage is applied for several seconds to several tens minutes. The pulse waveform is not limited to the chopping wave, but a desired waveform such as a rectangular wave may be applied.

Then, a case in which the voltage pulse is applied while the pulse wave peak value is increasing will be described with reference to FIG. 5(b). $T_1$ and $T_2$ in FIG. 5(b) may be identical with those shown in FIG. 5(a). The peak value (peak voltage) of the chopping wave can be increased, for example, every about 0.1 V step.

The completion of the electrification forming process can be detected by applying a voltage to the degree that does not locally destroy and deform the electrically conductive film 4 during the pulse interval $T_2$ and then measuring the current. For example, when a current flowing due to application of a voltage of about 0.1 V is measured, and a resistance is calculated and a resistance of 1 MΩ or more is obtained, the electrification forming is completed.

Figure 6:
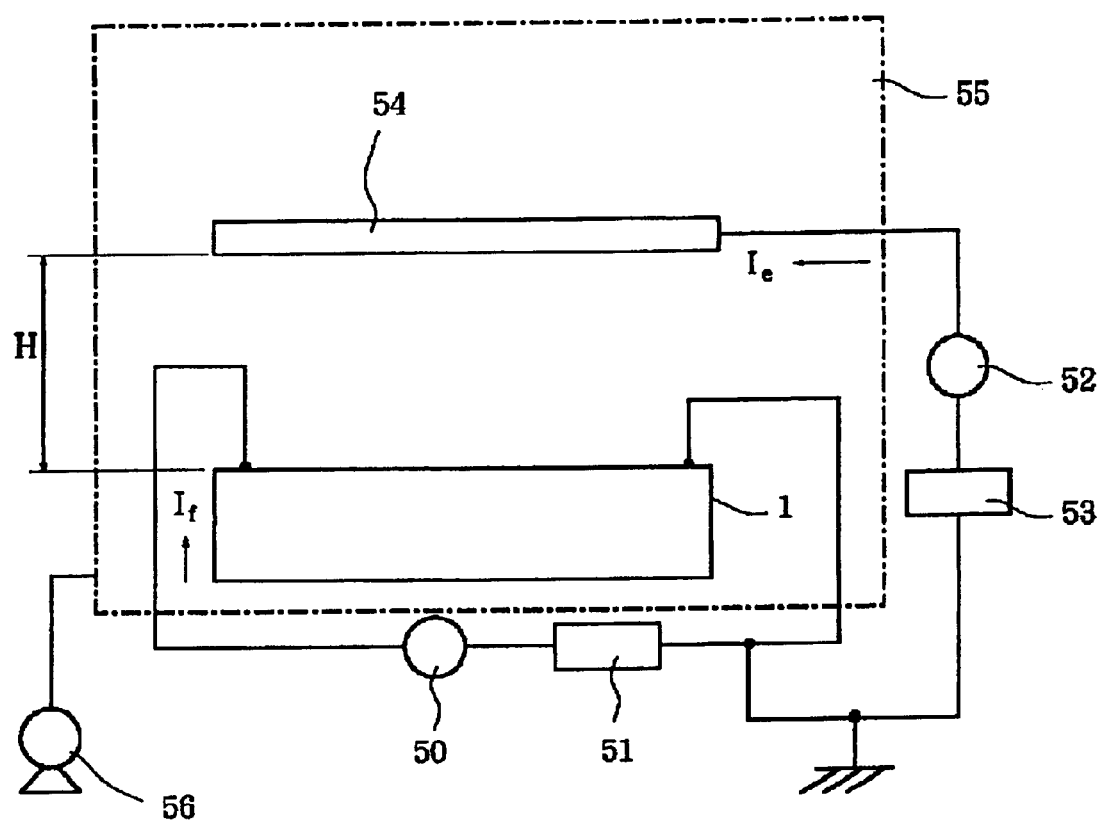
FIG. 6 is a schematically structural view showing an example of a vacuum processing device which is capable of being applied to a manufacturing method of the present invention.

The electric process subsequent to the forming process can be conducted within, for example, a vacuum processing device shown in FIG. 6. The vacuum processing device also functions as a measurement evaluating device.

Referring to FIG. 6, reference numeral 55 denotes a vacuum vessel, and 56 is an exhaust pump. The above-described substrate 1 is disposed within the vacuum vessel 55. Also, reference numeral 51 denotes a power supply for applying an element voltage $V_f$ between the above-described respective element electrodes 2 and 3, 50 is an ammeter for measuring an element current $I_f$ that flows with application of the element voltage, 54 is an anode electrode for catching the emission current $I_e$ emitted from the electron source on the substrate 1, 53 is a high voltage source for applying a voltage to an anode electrode 54, and 52 is an ammeter for measuring the emission current $I_e$ emitted. As an example, the measurement can be conducted under the conditions where a voltage across the anode electrode 54 is in a range of from 1 kV to 10 kV, and a distance H between the anode electrode 54 and the electron source is in a range of from 2 mm to 8 mm.

A device such as a vacuum gage not shown necessary for measurement under the vacuum environment is located within the vacuum vessel 55, and the measurement evaluation under a desired vacuum atmosphere is conducted.

The exhaust pump 56 is made up of a normal high vacuum device system made up of a turbo pump, a rotary pump or the like, and a super high vacuum device system made up of an ion pump or the like. The entire vacuum processing device where the substrate 1 is disposed in this example can be heated by a heater not shown.

5) Then, it is preferable to conduct a process which is called "activating process".

The activating process can be conducted, for example, by repeating the application of pulses between the respective element electrodes 2 and 3 under the atmosphere containing a gas of an organic material as in the electrification forming, and through this process, the element current $I_f$ and the emission current $I_e$ are remarkably changed, to thereby improve the electron emission efficiency and the lifetime of the respective electron emission elements.

The atmosphere containing a gas of the organic material in the activating process can be formed by utilizing an organic gas remaining within the atmosphere when a gas within the vacuum vessel is exhausted by using, for example, an oil dispersing pump, a rotary pump or the like. In addition, the atmosphere can be formed by introducing a gas of a proper organic material in vacuum which is sufficiently exhausted once by an ion pump using no oil. In this situation, because the preferable gas pressure of the organic material is different depending on the above-described formation of the element, the shape of the vacuum vessel, the kind of organic material, etc., it is appropriately set as occasion demands. The proper material may be aliphatic hydrocarbons such as alkane, alkene or alkyne, boric hydrocarbons, alcohol, organic acid such as aldehyde, ketone, amine, phenol, carvone or sulfonic acid. Specifically, there can be employed saturated hydrocarbon represented by $C_nH_{2n+2}$ such as methane, ethane or propane, unsaturated hydrocarbon represented by a composition formula of $C_nH_{2n}$ or the like such as ethylene or propylene, benzene, toluene, methanol, ethanol, formaldehyde, acetaldehyde, acetone, methyl ethyl ketone, methylamine, ethylamine, phenol, formic acid, acetic acid, propionic acid, etc.

Figure 2:
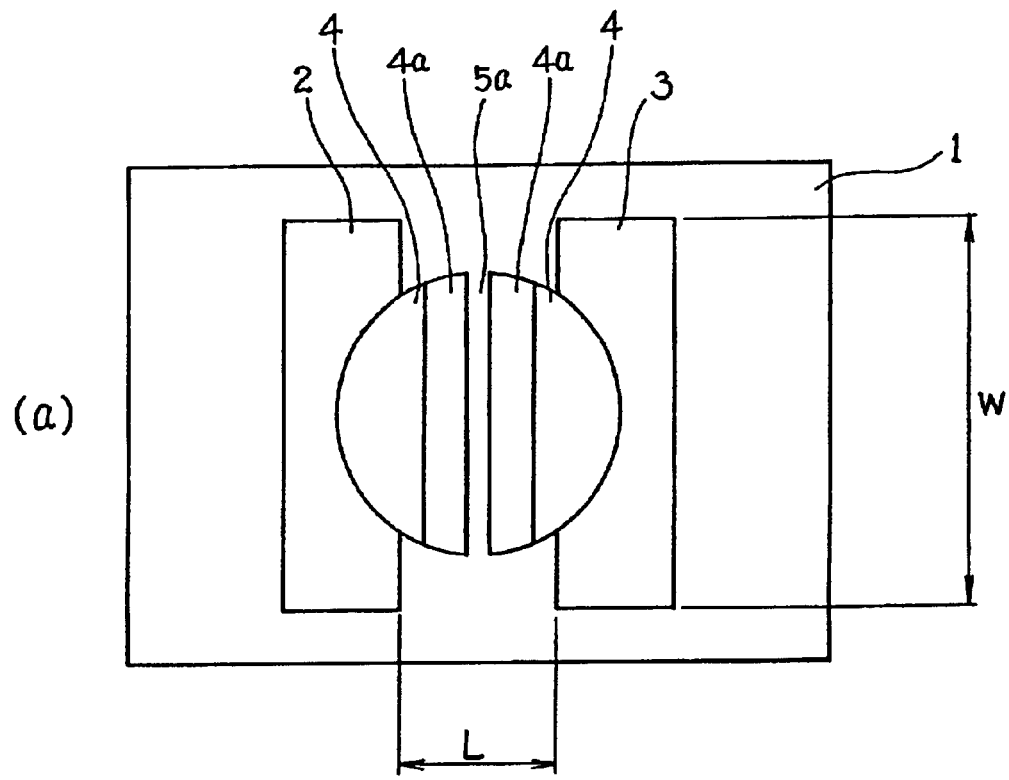
FIG. 2 is a schematic view showing another structural example of a surface conduction type electron emission element used in the present invention.
Figure 2:
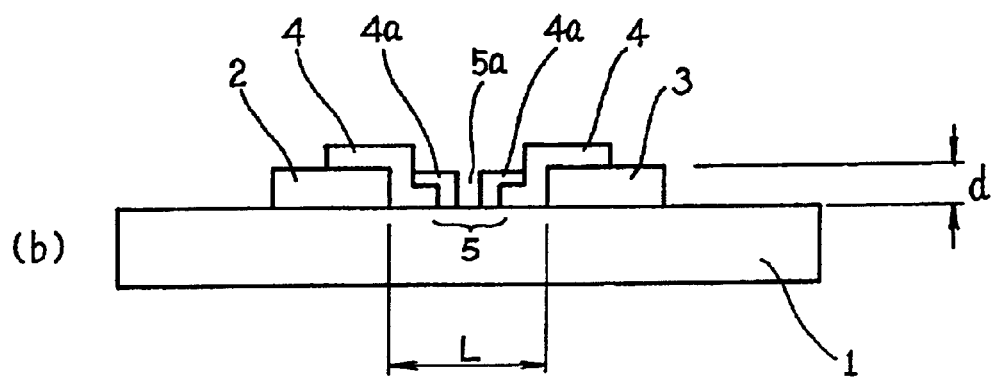

Through the above process, carbon or carbon compound is deposited on the respective electron emission elements from the organic material existing in the atmosphere into the above-described electron emission element having the structure shown in FIG. 2.

In this example, carbon or carbon compound is, for example, graphite (including so-called HOPG, PG and GC, and HOPG is directed to the substantially complete graphite crystal structure, PG is directed to graphite in which crystal grain is about 20 nm and the crystal structure is slightly disordered, and GC is directed to graphite in which crystal grain is about 2 nm and the crystal structure is further disordered), and amorphous carbon (directed to amorphous carbon, and the mixing material of amorphous carbon and the micro-crystal of the above graphite), and the thickness of carbon or carbon compound is preferably set to 50 nm or less and more preferably set to 30 nm or less.

The judgement of the completion of the activating process can be appropriately conducted while the element current $I_f$ and the emission current $I_e$ are measured.

6) It is preferable that the electron source obtained through the above processes is further subjected to a stabilizing process. This process is a process of exhausting the organic material within the vacuum vessel. It is preferable that a vacuum exhaust device that exhausts gas from the vacuum vessel is a device using no oil such that the characteristics of the respective electron emission elements are not affected by the oil generated from the device. Specifically, there can be applied a vacuum exhausting device such as a sorption pump or an ion pump.

The divided pressure of the organic compounds within the vacuum vessel is preferably set to a divided pressure under which carbon or carbon compound is not substantially newly deposited, that is, $10^{-6}$ Pa or less, and particularly preferably set to $10^{-8}$ Pa or less. In addition, it is preferable that when the entire gas is exhausted from the vacuum vessel, the entire vacuum vessel is heated so that the molecules of the organic material adsorbed by the inner wall of the vacuum vessel or the respective electron emission elements are liable to be exhausted. In this situation, the heating condition is to set to 80 to 250° C., and preferably set to 150° C. or higher and a heat treatment is conducted for a period of time as long as possible. It is necessary to reduce the pressure within the vacuum vessel as much as possible, preferably to $10^{-5}$ Pa or less, and more preferably to $10^{-6}$ Pa or less.

It is preferable that the atmosphere at the driving time after the stabilizing process has been conducted maintains the atmosphere after the above stabilizing process has been completed, but it is not limited to this, that is, the sufficient stable characteristic can be maintained even if the pressure per se is raised somewhat if the organic material is sufficiently removed. With the application of such vacuum atmosphere, the additional deposition of carbon or carbon compound can be suppressed, as a result of which the element current $I_f$ and the emission current $I_e$ are stabilized.

As described above, according to this embodiment, there is provided a step of ejecting a liquid droplet made of a solution containing at least the electrically conductive film formation material and giving the liquid droplet onto the substrate, and in the liquid droplet giving process, because the ejection is corrected on the basis of at least information as to a distance between the substrate and the ejection port, the variation in the distance between the ejection port and the substrate which is caused by the substrate, the stage, the driving shaft and so on can be absorbed.

Also, since the distance between the ejection port and the substrate can be reduced as much as possible, the liquid attachment precision can be improved, and the moving speed of the stage can be increased, to thereby improve the manufacture tact.

With the above structure, the electron source substrate excellent in element characteristic can be manufactured over the entire surface of the large-area substrate with an improved yield and at the low costs.

In addition, in the image forming apparatus using the above electron source, there is realized an image forming apparatus which requires a low current and is blight and high in grade, for example, a color flat television.

Subsequently, a second embodiment will be described in detail below.

In this embodiment, a droplet of a solution containing a material that forms the electrically conductive film 4 is given to the substrate 1 manufactured through the above processes 1) to 3) between the respective element electrodes 2 and 3 by using the liquid droplet giving device, and then burned at 300 to 400° C., to thereby form the electrically conductive film 4 between the above respective electrodes 2 and 3, as in the first embodiment.

Figure 7:
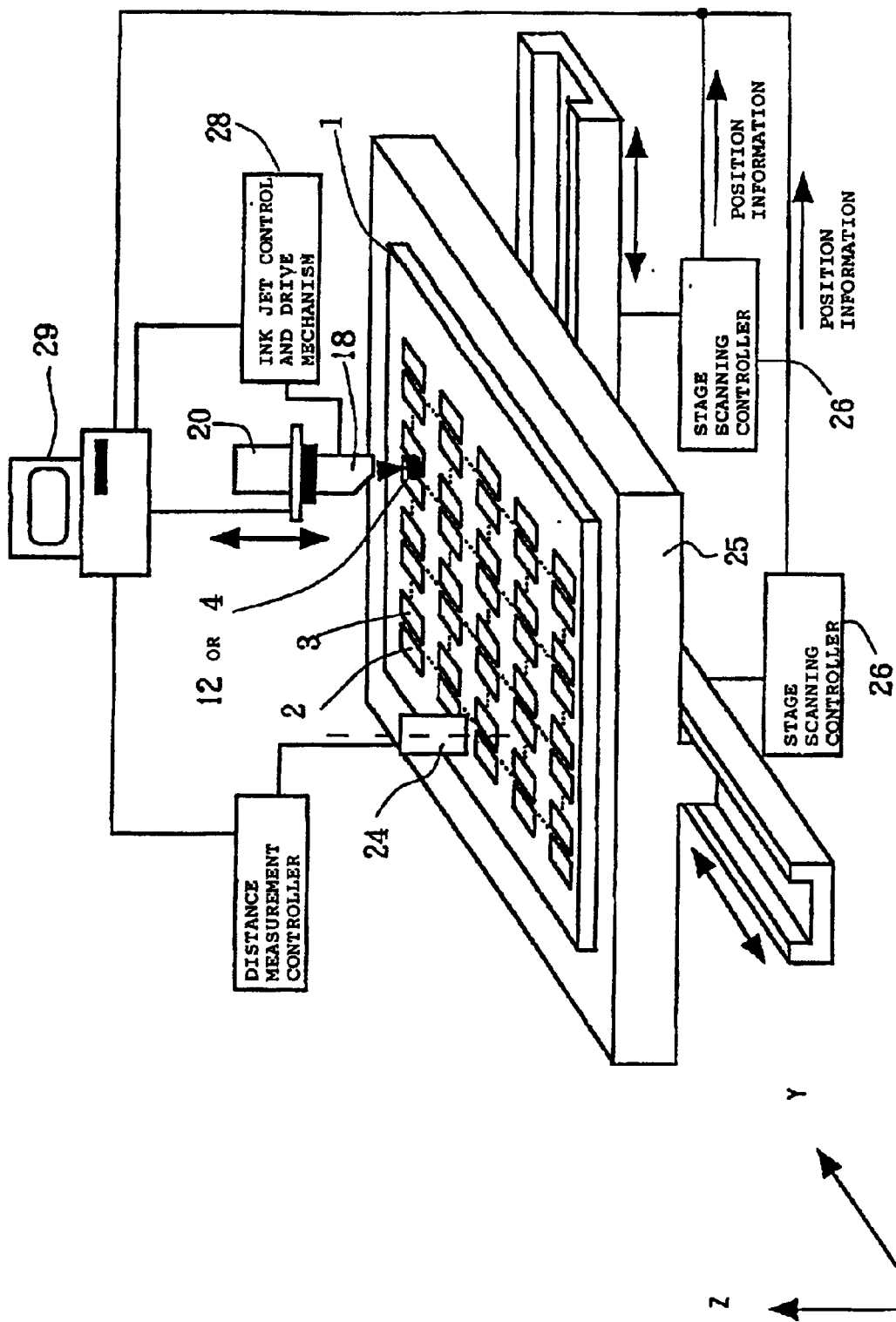
FIG. 7 is a schematic view showing a device for manufacturing an electron source in accordance with a second embodiment of the present invention.
Figure 8:
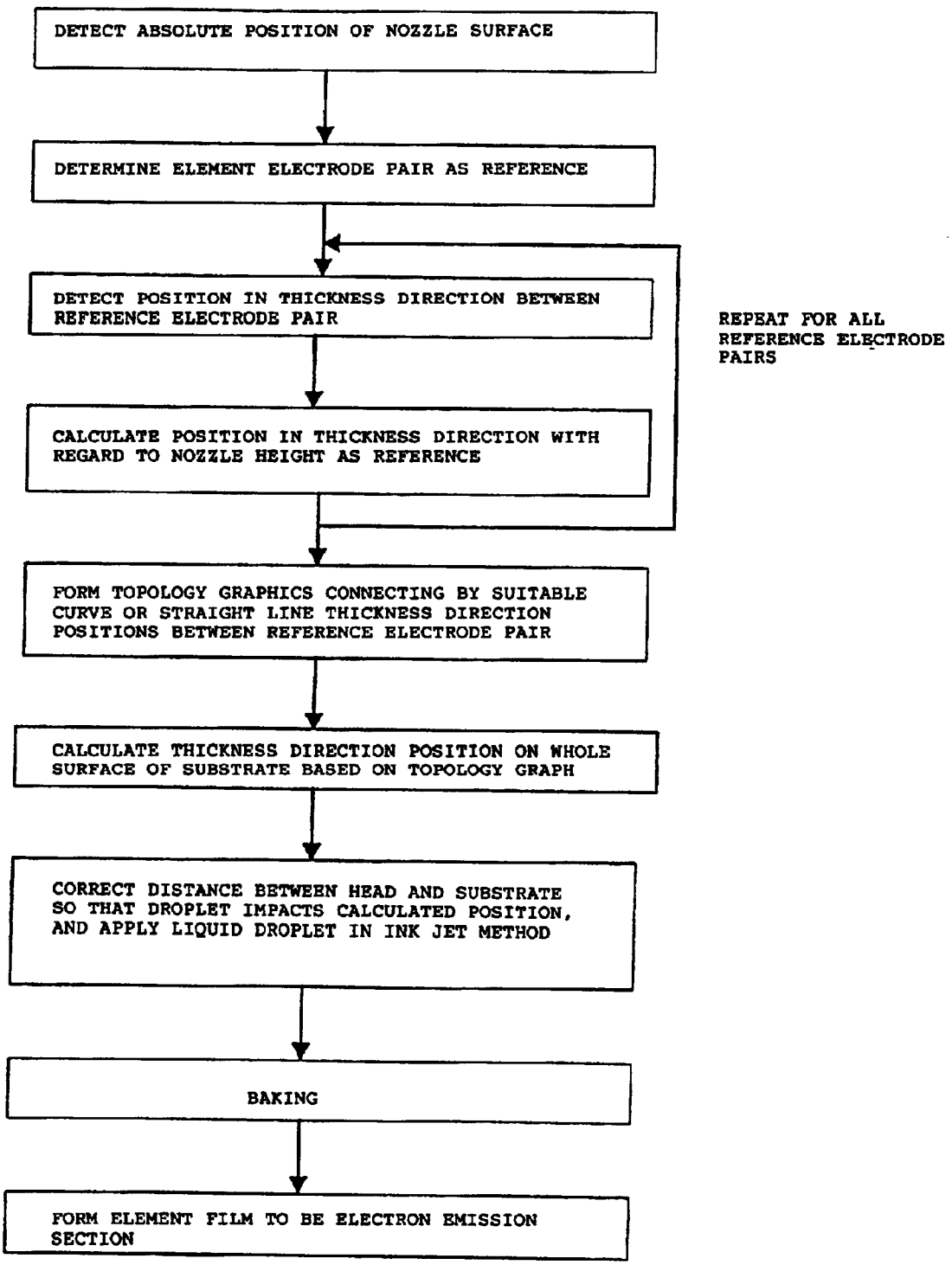
FIG. 8 is a process diagram showing a procedure of forming an electrically conductive film.
Figure 9:
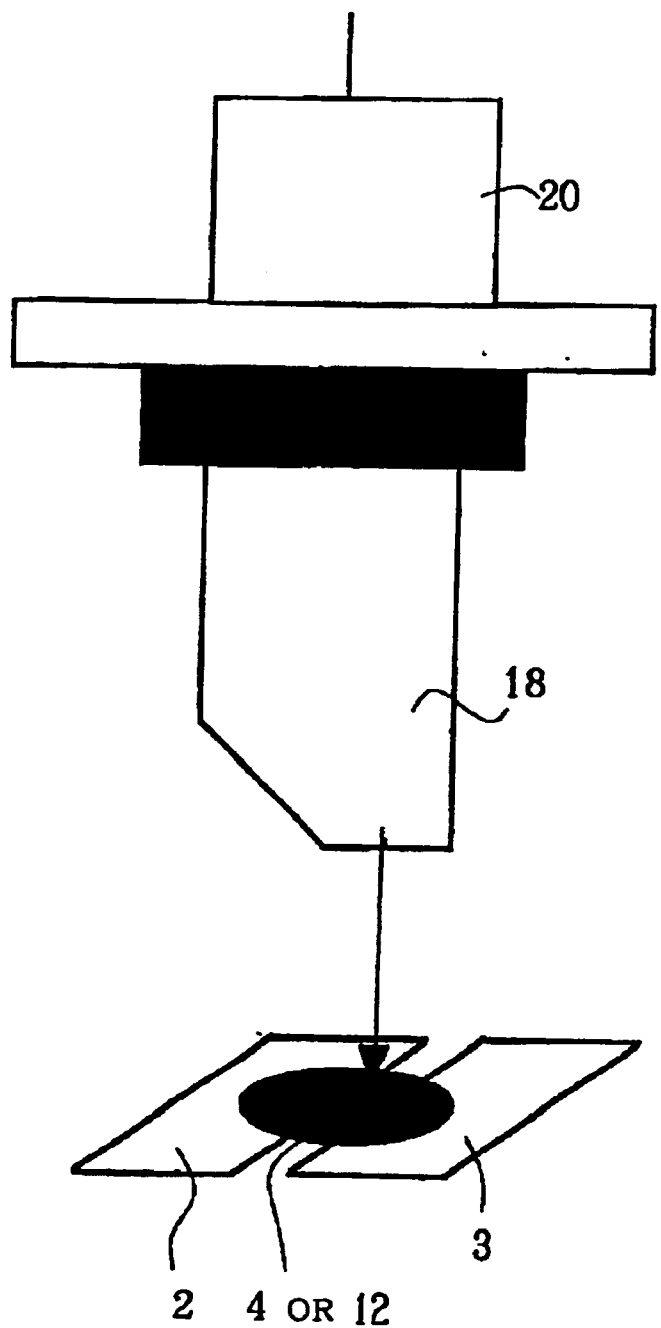
FIG. 9 is a schematically structural view showing a droplet giving device and a vertically driving mechanism in FIG. 7.

FIG. 7 is a schematic view showing a device for manufacturing an electron source in accordance with this embodiment, FIG. 8 is a flowchart showing a process of forming an electrically conductive film, and FIG. 9 is a schematically structural view showing a liquid droplet giving device and a vertically driving mechanism in FIG. 7.

Referring to FIGS. 7 and 9, reference numeral 1 denotes a substrate on which element electrodes 2 and 3 and wirings (not shown) that apply a voltage to those electrodes are formed; 18, a liquid droplet giving device; 20, a vertically driving mechanism of the liquid droplet giving device; 12, a liquid droplet; 24, a device for measuring a distance between the substrate 1 and the liquid droplet giving device 18; 25, a stage with an X- and Y-direction scanning mechanism; 26, a stage position detecting mechanism; 28, a control/drive mechanism of the liquid droplet giving device 18; and 29, a control computer.

The liquid droplet giving device 18 and the solution which is given to the substrate may be identical with those in the above-described first embodiment.

The substrate 1 is fixed onto the stage 25 and scanned in X- and Y-directions by the X- and Y-direction scanning mechanism provided in the stage. The absolute position of the stage 25 is detected by the position detecting mechanism 26.

Using the above device, the substrate 1 fixed onto the stage 25 is continuously scanned in the X- and Y-directions, and when the substrate 1 reaches a desired position, the liquid droplet 12 is ejected by the liquid droplet giving device 18 to give the liquid droplet 12 to a desired position on the element electrodes 2 and 3 and then form the electrically conductive film 4 by burning, etc. However, as described in the first embodiment, the substrate 1 has the distribution of the thickness due to the thickness unevenness of the original substrate, the distortion during the manufacturing process, etc. Also, since the flatness of the stage 25 per se and the parallel degree when the stage 25 is scanned in the X- and Y-directions are not kept constant, the distance between the liquid droplet giving device 18 and the substrate 1 is changed depending on a location of the substrate with the results that the liquid droplet cannot be given to a position according to a designed value, and the yield is remarkably deteriorated.

Under the above circumstances, in this embodiment, the device shown in FIG. 7 is used, the position of the entire surface of the substrate in the thickwise direction by the procedure shown in FIG. 8 is calculated, and the interval between the liquid droplet giving device 18 and the substrate 1 is unified in accordance with the positional information, with the results that the liquid droplet is given to an optimum position on all the elements (a pair of electrodes), to thereby improve the yield. This procedure will be described below.

In order to determine the positional relationship between the tip surface of the nozzle of the liquid droplet giving device 18 and the substrate 1 in a Z-direction in advance, the position in the thickwise direction of the substrate (Z-direction) is detected with respect to not only all the element electrode pairs, but also portions on a partial specific element electrode pair to which the liquid droplet is given. As a manner of detecting the position (distance), an optical manner by a laser length measuring device, etc., can be employed. The number of electrode pairs to be positionally detected may not be limited and those electrode pairs may be disposed on arbitrary locations if the electrode pairs sufficiently calculate the thickwise (Z-direction) droplet given position on other electrode pairs which do not directly detect a position on the same substrate. In this embodiment, the positions in the Z-direction are obtained on 16 points in total which are made up of the points between the respective electrode pairs of four pairs of element electrodes at four corners of the substrate and points between the respective electrode pairs of two pairs of element electrodes which are situated in the middle portions of those four pairs, respectively.

The thus obtained positional information as to the 16 points on the substrate in the thickwise direction is inputted to the control computer 29, and the intervals between those 16 points are supplemented by a straight line (one-dimensional curve), to thereby obtain the positions in the thickwise direction (Z-direction) of the substrate between all the element electrode pairs on those lines. Also, if necessary, supplementation can be made by multi-dimensional curves.

As to the number of electrode pairs which detect the shape of the curve and the positions necessary for supplementation, each of the substrates has a function of appropriately changing the number of electrode pairs, and necessary element electrode logarithm and the supplementing method can be selected taking the yield, the manufacturing period of time, etc., into consideration.

On the basis of the position in the thickwise direction of the substrate surface thus calculated and the position of the nozzle tip surface of the liquid droplet giving device 18 which has been obtained in advance, a distance between the liquid droplet giving device and the substrate is calculated, and the substrate 1 fixed onto the stage 25 is continuously scanned in the X- and Y-directions while that distance is maintained constant, and the liquid droplets 12 are given to desired positions between the respective electrode pairs on the substrate 1.

The distance measuring device 24 may be made by a non-contact manner represented by an optical device such as a laser interferometer or a focus system that combines a CCD camera with a microscope, or a contact manner represented by a push-pull system, which can be realized by devices on the market, respectively.

Thereafter, the substrate 1 to which the liquid droplet has been given is burned at 300 to 400° C., to thereby form the electrically conductive films 4 between the respective electrode pairs.

Subsequently, electrification is conducted between the element electrodes 2 and 3 by a power supply not shown, which is called "electrification forming," as in the above-described first embodiment, to thereby form a fissure 5 that forms the electron emission portion on a part of the electrically conductive film 4.

Then, the element which has been subjected to the electrification forming is preferably subjected to the activating process as in the above-described first embodiment, and carbon or carbon compound is deposited on the electrically conductive film.

In addition, the subsequent processes are also identical with those in the above-described first embodiment.

As described above, according to the manufacturing device and the manufacturing method for the electron source substrate of this embodiment, a reduction in the number of steps of manufacturing the electron source substrate, an improvement in the yield and a reduction in the costs can be realized as compared with the prior art.

In the above-described first and second embodiments, the calculation of the positions on the substrate surface in the thickwise direction of the substrate does not need to be conducted for each of the substrates, and it is desirable that the calculation is conducted for plural substrates or for each change of the kind of substrate or the method of forming the member formed on the substrate in advance.

A description will be given of an example of an image forming apparatus structured by using the electron source in which a plurality of electron emission elements are arranged in matrix by a plurality of column wirings and a plurality of row wirings with reference to FIGS. 10, 11 and 12.

Figure 10:
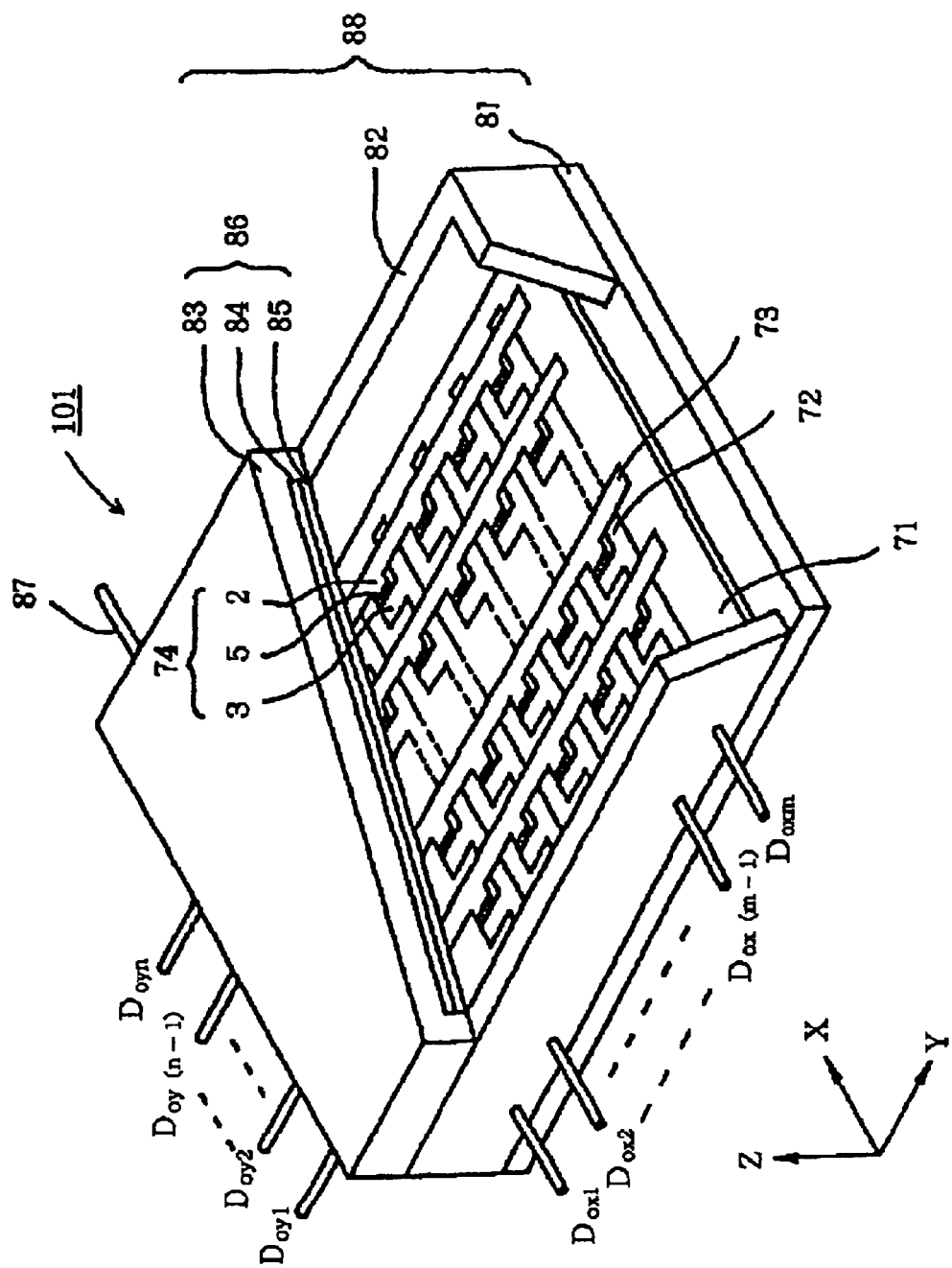
FIG. 10 is a schematic view showing an example of a display panel of an image forming apparatus.
Figure 11:
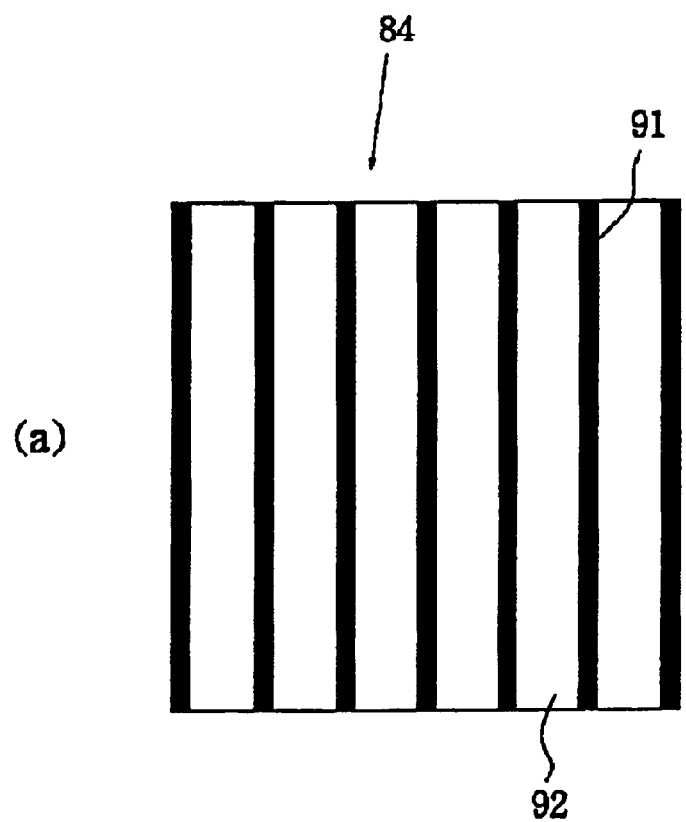
FIG. 11 is a schematic view showing a fluorescent film used in the image forming apparatus show in FIG. 10.
Figure 11:
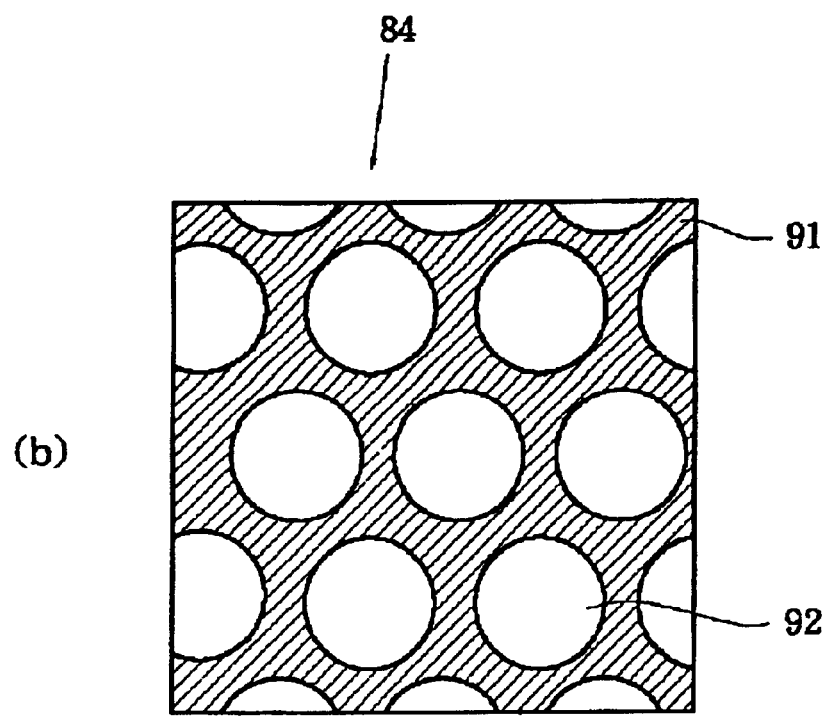
Figure 12:
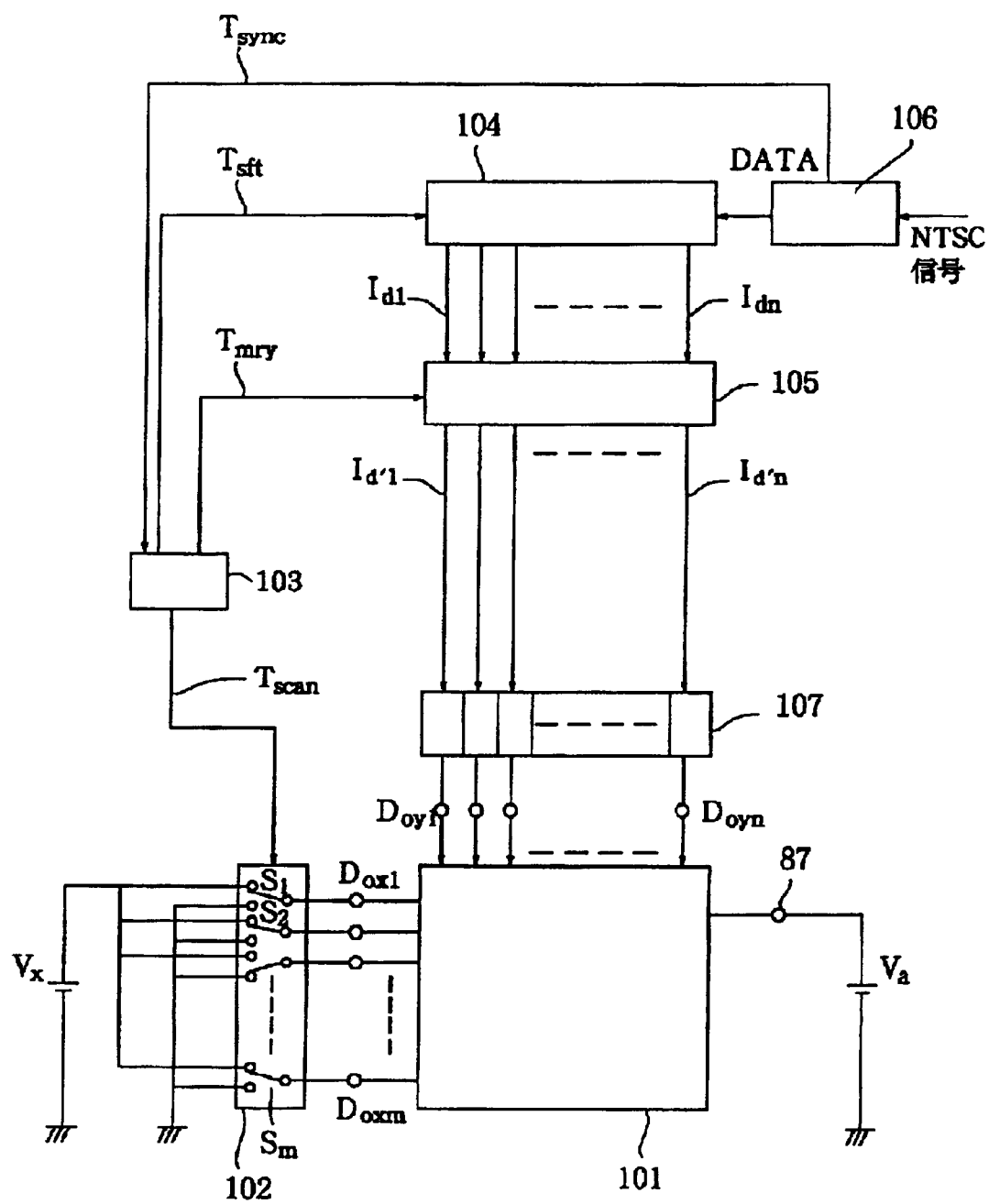
FIG. 12 is a block diagram showing an example of a drive circuit for displaying in response to a television signal of an NTSC system.

FIG. 10 is a schematic view showing an example of a display panel of an image forming apparatus, FIG. 11 is a schematic view showing a fluorescent film used in the image forming apparatus show in FIG. 10, and FIG. 12 is a block diagram showing an example of a drive circuit for displaying in response to a television signal of an NTSC system.

Referring to FIG. 10, reference numeral 71 denotes an electron source substrate in which a plurality of electron emission elements described above are arranged; 81, a rear plate fixed with the electron source substrate 71; and 86, a face plate in which a fluorescent film 84, a metal back 85, etc., are formed on an inner surface of a glass substrate 83. Reference numeral 82 denotes a support frame, and the support frame 82 is connected with the rear plate 81 and the face plate 86 through a flit glass or the like. Reference numeral 88 denotes an envelope which is, for example, burned in the atmosphere or nitride at a temperature of 400 to 500° C. for 10 minutes or longer, for sealing.

Reference numeral 74 denotes electron emission elements as shown in FIGS. 1 and 2. Reference numeral 72 and 73 are a row wirings and column wirings which are connected to a pair of element electrodes of the surface conduction type electron emission element.

The envelope 88 is made up of the face plate 86, the support frame 82 and the rear plate 81 as described. Because the rear plate 81 is provided mainly for the purpose of reinforcing the strength of the substrate 71, if the substrate 71 per se has a sufficient strength, the separately provided rear plate 81 may be unnecessary. In other words, the support frame 82 may be directly sealingly attached to the substrate 71 so that the envelope 88 is made up of the face plate 86, the support frame 82 and the substrate 71. On the other hand, if a support member not shown which is called "spacer" is located between the face plate 86 and the rear plate 81, the envelope 88 having a sufficient strength against the atmospheric pressure can be structured.

FIG. 11 is a schematic view showing a fluorescent film. The fluorescent film 84 may be structured by only a fluorescent substance in the case where it is monochrome. In the case where the film of a color fluorescent film, the fluorescent film 84 may be formed of a black conductive member 91, which is called "black stripes" (FIG. 11(a)) or "black matrix" (FIG. 11(b)), etc. and a phosphor 92, due to the arrangement of the phosphor. The purposes of providing the black stripes or the black matrix are to make a mixed color, etc., neutral by blacking the boundary portions of the respective phosphors 92 of three primary color phosphors required in case of color display, and to suppress the deterioration of contrast due to reflection of the external light on the fluorescent film 84. The material of the black conductive member 91 can be made of a material that mainly contains black lead which is generally used, or a material which is electrically conductive and small in the transmission and refection of a light.

A method of coating the phosphor on the glass substrate 83 can be applied with a sedimentation, printing method, etc., regardless of monochrome or color. The metal back 85 is normally disposed on the inner surface of the fluorescent film 84. The purposes of providing the metal back are to improve the luminance by mirror-reflecting a light directed to the inner surface among the light emission of the phosphor to the face plate 86 side, to operate the metal back as an electrode for applying an electron beam accelerating voltage, to protect the phosphor from any damage due to collision of negative ions produced within the envelope, etc. The metal back can be manufactured by smoothing the inner surface of the fluorescent film (normally called "filming") and then depositing Al through the vacuum evaporation, etc after the fluorescent film is manufactured.

The face plate 86 may be provided with a transparent electrode (not shown) at the outer surface side of the fluorescent film 84 in order to further increase conductivity of the fluorescent film 84.

When the above sealing attachment of the envelope is conducted, in case of color, the respective color phosphors needs to correspond to the electron emission elements, and the sufficient positioning is essential.

The image forming apparatus shown in FIG. 10 is manufactured, for example, as follows:

The gas within the envelope 88 is exhausted through an exhaust tube (not shown) by an exhausting device using no oil such as an ion pump or a sorption pump while being appropriately heated to provide the atmosphere sufficiently small in the amount of organic material with the degree of vacuum of about $10^{-5}$ Pa, and thereafter sealing is conducted. In order to maintain the degree of vacuum after the envelope 88 is sealed, a gettering process may be conducted.

This is a process in which a getter (not shown) disposed at a given position within the envelope 88 is heated due to heating using resistor heating, high frequency heating, etc., immediately before the envelope 88 is sealed or after the envelope 88 has been sealed, to thereby form a deposition film. In general, the getter mainly contains Ba, etc. and maintains the degree of vacuum of, for example, $1 \times 10^{-5}$ Pa or more due to the adsorption action of the deposition film. In this example, the processes subsequent to the forming process of the electron emission element can be appropriately set.

Subsequently, a description will be given of an structural example of a drive circuit for conducting television display on the basis of a television signal of an NTSC system on the display panel structured by using the electron source of the simple matrix arrangement with reference to FIG. 12. Referring to FIG. 12, reference numeral 101 denotes an image display panel; 102, a scanning circuit; 103, a control circuit; 104, a shift register; 105, a line memory; 106, a synchronous signal separating circuit; 107, a modulated signal generator; and Vx and Va are d.c. voltage sources.

The display panel 101 is connected to an external electric circuit through terminals $D_{ox1}$ to $D_{oxm}$, terminals $D_{oy1}$ to $D_{oyn}$, and a high voltage terminal 87. The terminals $D_{ox1}$ to $D_{oxm}$ are applied with a scanning signal for sequentially driving the electron source disposed within the display panel 101, that is, the electron emission element group which are arranged in matrix of m×n one line by one line (n element). The terminals $D_{oy1}$ to $D_{oyn}$ are applied with a modulated signal for controlling an output electron beam of the respective elements of one-row electron emission elements selected in accordance with the scanning signal. The high voltage terminal 87 is applied with a d.c. voltage of, for example, 10 kV by the d.c. voltage source Va. This is an accelerating voltage for giving an energy sufficient to excite the phosphor to an electron beam emitted from the electron emission elements.

The scanning circuit 102 will be described. The scanning circuit 102 includes m-switching elements (in the figure, schematically represented by $S_1$ to $S_m$) therein. The respective switching elements select any one of the output voltage of the d.c. voltage power supply Vx and O [V] (ground level) and are electrically connected to the terminals $D_{ox1}$ to $D_{oxm}$ of the display panel 101. The respective switching elements $S_1$ to $S_m$ operate on the basis of a control signal $T_{scan}$ outputted from the control circuit 103 and can be structured with the combination of switching elements such as FETs.

In this example, the d.c. voltage source Vx is so set as to output a constant voltage such that a drive voltage applied to an element which is not scanned becomes an electron emission threshold voltage or less, on the basis of the characteristic of the electron emission elements (electron emission threshold voltage).

The control circuit 103 has a function of matching the operation of the respective members with each other such that appropriate display is conducted on the basis of an image signal inputted from the external. The control circuit 103 generates the respective control signals of $T_{scan}$, $T_{sft}$ and $T_{mry}$ to the respective members on the basis of a synchronous signal $T_{sync}$ transmitted from the synchronous signal separating circuit 106.

The synchronous signal separating circuit 106 is a circuit for separating a synchronous signal component and a luminance signal component from the television signal of the NTSC system which is inputted from the external and can be made up of a general frequency dividing (filtering) circuit and so on. The synchronous signal separated by the synchronous signal separating circuit 106 consists of a vertical synchronous signal and a horizontal synchronous signal, but is shown as a signal $T_{sync}$ in this example for convenience of description. The luminance signal component of an image which is separated from the television signal is represented as a DATA signal for convenience. The DATA signal is inputted to the shift register 104.

The shift register 104 is so designed as to serial-parallel convert the DATA signal inputted in serial temporarily for each one line of an image and operates on the basis of the control signal $T_{sft}$ transmitted from the control circuit 103 (that is, the control signal $T_{sft}$ is also called "shift clock" of the shift register 104).

The data for one line in an image which has been converted from serial to parallel (corresponding to the drive data of n-elements of the electron emission elements) is outputted from the shift register 104 as n-parallel signals of $I_{d1}$ to $I_{dn}$.

The line memory 105 is a memory device for storing the data for one line of the image for a required period of time, and stores the contents of $I_{d1}$ to $I_{dn}$ in accordance with the control signal $T_{ary}$ transmitted from the control circuit 103. The stored contents are outputted as $I_{d'1}$ to $I_{d'n}$ and then inputted to the modulated signal generator 107.

The modulated signal generator 107 is a signal source for appropriately driving and modulating the respective electron emission elements in accordance with the respective image data $I_{d'1}$ to $I_{d'n}$, and its output signal is supplied to the electron emission elements within the display panel 101 through the terminals $D_{oy1}$ to $D_{oyn}$.

Also, as a system of modulating the electron emission element in accordance with the input signal, there can be applied a voltage modulating system, a pulse width modulating system and so on. In implementing the voltage modulating system, as the modulated signal generator 107, there can be used a circuit of the voltage modulating system which generates a voltage pulse of a constant length and can appropriately modulate a wave peak value of the voltage pulse in accordance with inputted data. In implementing the pulse width modulating system, as the modulated signal generator 107, there can be used a circuit of the pulse width modulating system which generates a voltage pulse of a constant wave peak value and can appropriately modulate the width of the voltage pulse in accordance with inputted data.

The shift register 104 and the line memory 105 may be of the digital signal system or the analog signal system. This is because the serial to parallel conversion of the image signal and the storage may be conducted at a given speed.

In the case of using the digital signal system, it is necessary to convert the output signal DATA of the synchronous signal separating circuit 106 into a digital signal, and in this case, an A/D convertor may be disposed on an output portion of the synchronous signal separating circuit 106. With being associated with the above structure, a circuit used in the modulated signal generator 107 is slightly different depending on whether the output signal of the line memory 105 is a digital signal or an analog signal. That is, in case of the voltage modulating system using the digital signal, the modulated signal generator 107 is equipped with, for example, a D/A converting circuit, and an amplifying circuit or the like is added to the generator 107 as occasion demands. In case of the pulse width modulating system, the modulated signal generator 107 is equipped with, for example, a circuit combining a high-speed oscillator, a counter that counts a wave number outputted from the oscillator, and a comparator which compares an output value of the counter with an output value of the memory together. As occasion demands, an amplifier which voltage-amplifies the modulated signal which is outputted from the comparator and modulated in pulse width up to the drive voltage of the electron emission elements may be added to the circuit.

In case of the voltage modulating system using the analog signal, the modulated signal generator 107 may be equipped with, for example, an amplifying circuit using an operational amplifier, etc., and as occasion demands, a level shifting circuit, etc., may be added to the system. In case of the pulse width modulating system, for example, a voltage control type oscillating circuit (VCO) can be applied, and as occasion demands, an amplifier for voltage-amplifying the modulated signal up to a drive voltage of the electron emission elements may be added to the system.

In the image forming apparatus thus structured, a voltage is applied to the respective electron emission elements through the terminals $D_{ox1}$ to $D_{oxm}$ and the terminals $D_{oy1}$ to $D_{oyn}$ disposed in the exterior of the vessel, to thereby cause electron emission. A high voltage is applied to the metal back 85 or the transparent electrode (not shown) through a high voltage terminal 87, to thereby accelerate an electron beam. The accelerated electrons collide with the fluorescent film 84 to emit a light, thereby forming an image.

The above-described structure of the image forming apparatus is an example of the image forming apparatus to which the present invention is applicable, and various deformation can be made. The input signal is of the NTSC system in this embodiment, but the input signal is not limited to this system and is applicable to the PAL and SECAM systems, etc., and also a TV signal (for example, a high-grade TV including the MUSE system) system with a larger number of scanning lines than the PAL and SECAM systems.

Also, the above-described method of manufacturing the electron source is not limited to the electron source of the matrix wiring as described in the first and second embodiments, but an electron source of the lattice-type arrangement which will be described later can be manufactured. The electron source of the lattice-type arrangement and an image forming apparatus using the electron source of the lattice-type arrangement will be described with reference to FIGS. 13 and 14.

Figure 13:
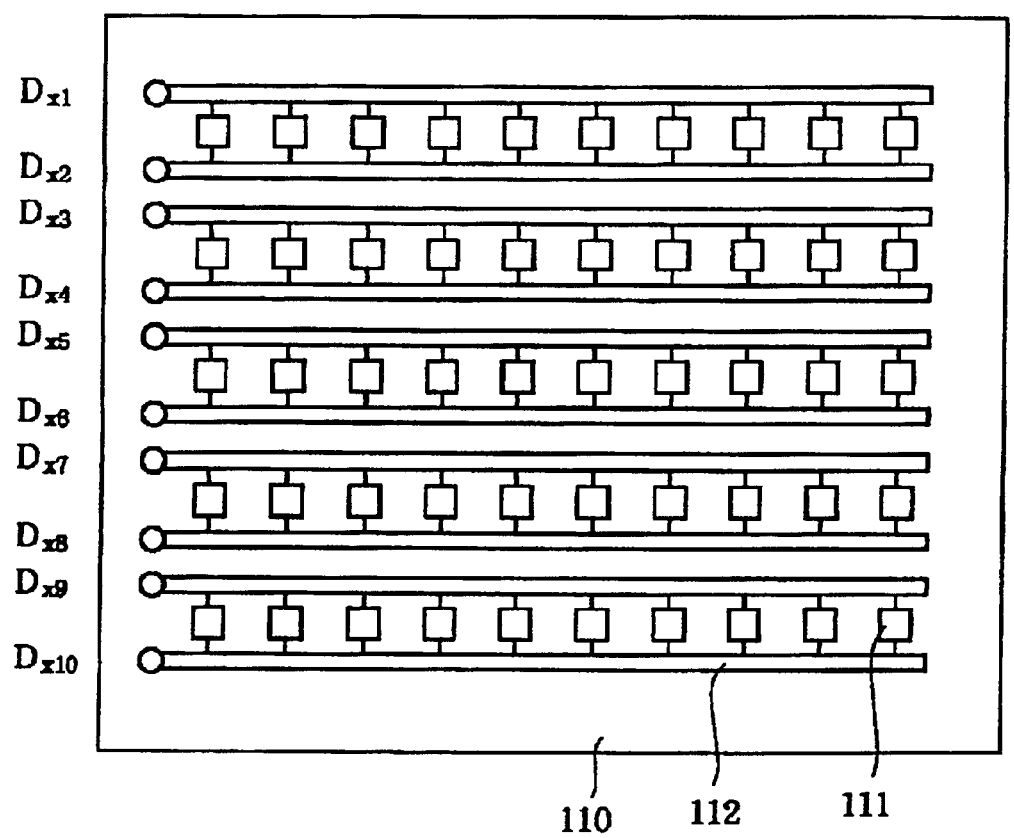
FIG. 13 is a schematic view showing an example of electron sources which are arranged in the form of a lattice.

FIG. 13 is a schematic view showing an example of electron sources which are arranged in the form of a lattice. Referring to FIG. 13, reference numeral 110 denotes an electron source substrate; and 111 is electron emission elements. Reference numeral 112 denotes common wirings $D_{x1}$ to $D_{x10}$ for connecting the electron emission element 111 which are drawn as external terminals. A plurality of electron emission elements 111 are disposed on the substrate 110 in parallel in the X-direction (called "element row"). A plurality of element rows are disposed to constitute the electron source. When the drive voltage is applied between the common wirings of the respective element rows, the respective element rows can be driven independently. That is, the element rows from which the electron beam is intended to be emitted are applied with a voltage of an electron emission threshold value or higher whereas the element rows from which the electron beam is not intended to be emitted are applied with a voltage of the electron emission threshold value or lower. The common wirings $D_{x2}$ to $D_{x9}$ positioned between the respective element rows can be made by integrating, for example, $D_{x2}$ and $D_{x3}$, $D_{x4}$ and $D_{x5}$, $D_{x6}$ and $D_{x7}$, and $D_{x8}$ and $D_{x9}$ into the same wiring, respectively.

Figure 14:
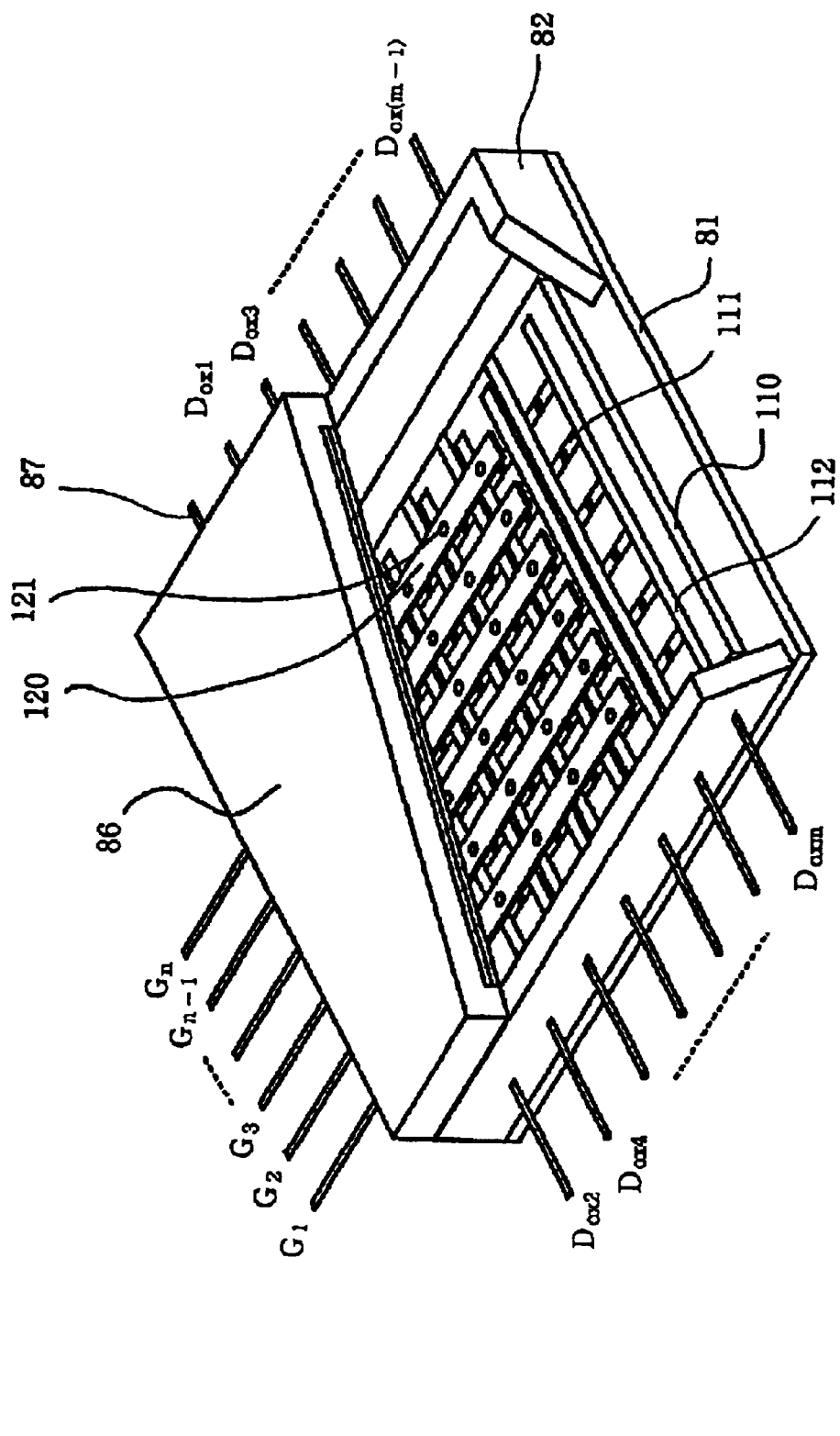
FIG. 14 is a schematic view showing an example of a panel structure in the image forming apparatus having the electron sources which are arranged in the form of a lattice.

FIG. 14 is a schematic view showing an example of a panel structure in the image forming apparatus having the electron sources which are arranged in the form of a lattice. Reference numeral 120 denotes grid electrodes; 121 is openings through which electrons pass; $D_{ox1}$ to $D_{oxm}$ are terminals external to the vessel; and $G_1$ to $G_n$ are terminals connected to the grid electrode 120 and external to the vessel. Reference numeral 110 denotes an electron source substrate having the common wirings between the respective element rows integrated together. In FIG. 14, the same parts as those shown in FIGS. 10 and 13 are designated by identical symbols as those in these figures. A great difference between the image forming apparatus shown in FIG. 14 and the image forming apparatus of the simple matrix arrangement shown in FIG. 10 resides in that whether the grid electrodes 120 are disposed between the electron source substrate 110 and the face plate 86 or not.

Referring to FIG. 14, the grid electrodes 120 are disposed between the substrate 110 and the face plate 86. The grid electrodes 120 are so designed as to modulate the electron beam emitted from the elect emission elements 111 and has one circular opening 121 for each of the elements in order that the electron beam is allowed to pass through the stripe electrodes disposed orthogonal to the element rows of the lattice-type arrangement. The shape of the grid electrodes and the position at which the grid electrodes are arranged are not limited to what are shown in FIG. 14. For example, a large number of passage ports can be disposed in mesh as openings, or the grid electrodes can be disposed around or in the vicinity of the electron emission elements.

The vessel external terminals $D_{ox1}$ to $D_{oxm}$ and the grid vessel external terminals $G_1$ to $G_n$ are electrically connected to a control circuit not shown.

In the image forming apparatus according to this embodiment, the modulated signal for one line of the image is supplied to the grid electrode columns at the same time in synchronism with the sequential drive (scanning) of the element rows column by column. With this operation, the irradiation of the respective electron beams to the phosphor is controlled, thereby being capable of displaying the image one line by one line.

The image forming apparatus as described above can be employed as a display device for a television broadcast, a display device for a television conference system, a computer, or the like, an image forming apparatus structured by using a photosensitive drum and so on as an optical printer, etc.

Hereinafter, the present invention will be described with reference to specific examples. However, the present invention is not limited to those examples and includes the replacement of the respective elements and a change in the design within a scope where the objects of the present invention can be achieved.

EXAMPLE 1

The basic structure of an electron emission element in accordance with this example is identical with that shown in FIG. 1, and the basis structure of an electron source having the plurality of electron emission elements is identical with that shown in FIG. 3. Also, the method of manufacturing the electron source according to this example is basically identical with that shown in FIG. 4.

An electron source substrate having a large number of surface conduction type electron emission elements was manufactured by using a substrate on which wirings and element electrodes are formed in matrix.

Hereinafter, a description will be given with reference to FIGS. 3 and 4.

Step-a:

A soda lime glass substrate of 900×600 (mm) was used as the insulating substrate 1, and after the glass substrate has been sufficiently cleaned by an organic solvent or the like, it was dried at 120° C. The element electrodes 2 and 3 made of Pt were formed on the substrate 1 through a vacuum film forming technique and a photolithgraphy technique. In this situation, the thickness of Pt was set to 200 Å, and a distance between the element electrodes 2 and 3 is set to 2 μm.

Step-b:

Subsequently, the column wirings 11 made of Ni were formed through the vacuum film forming technique and the photolithgraphy technique. The width of the column wirings 11 was set to 300 μm, and its thickness was set to 500 Å. In addition, the insulating film 6 was formed on the column wirings 11 through the vacuum film forming technique, the photolithgraphy technique and the etching technique. The thickness of the insulating film 6 was set to 5000 Å. Then, the row wirings 10 made of Au were formed through the vacuum film forming technique and the photolithgraphy technique. The width of the row wirings 10 was set to 200 μm, and its thickness was set to 5000 Å.

Step-c:

The substrate is adsorbed by the stage 8 of the liquid droplet giving device shown in FIG. 4, and as a result of measuring the distance D between the ejection port and the substrate over the entire surface of the substrate by using the distance measuring sensor 9, a variation of the distance D between the ejection port and the substrate over the entire surface of the substrate was 200 μm.

Step-d:

The basic value of the distance D between the ejection port and the substrate was set to 300 μm, and a droplet 12 of a solution containing a material that forms the electrically conductive film 4 was given while as a variable value over the entire surface of the substrate, D was kept constant by vertically moving the head 7 by the piezoelectric element attached onto the head portion.

The solution as used was an organic paradium solution (aqueous solution of acetic acid Pd-monoethanolamine complex 0.4 wt %, isopropyl alcohol 20%, ethylene glycol 1.0%, and polyvinyl alcohol 0.05%).

The scanning speed of the stage 8 was set to 500 mm/sec at this time. The ejecting speed of the liquid droplet was set to about 10 m/sec.

Step-e:

In addition, a heat treatment was conducted at 300° C. for 10 minutes, to thereby form the electrically conductive film 4 made of paradium oxide (PdO) fine particles 100 Å in thickness.

Step-f:

Then, a voltage was applied between the element electrodes 2 and 3 and the electrifying process was conducted on the electrically conductive film 4 (electrification forming), to thereby form the fissure 5 in the electrically conductive film 4.

Step-g:

By using the electron source substrate thus manufactured, the envelope 88 was formed by the face plate 86, the support frame 82 and the rear plate 81 as shown in FIG. 10, and sealing is conducted to manufacture a display panel and also an image forming apparatus having a drive circuit for conducting the television display on the basis of a television signal of the NTSC system as shown in FIG. 12.

Because the electron emission element manufactured by the manufacturing method according to this example is excellent in the precision of the liquid attached position on the electrically conductive film, the variation in the shape of the electrically conductive film between the element electrodes 2 and 3 and the resistance before electrification forming is small.

For that reason, a current uniformly flows in the electrically conductive film, the fissure is uniformly formed, and the current also uniformly flows in the electron emission element to reduce the variation in the element characteristic, thereby being capable of obtaining an excellent image forming apparatus with an improved yield.

EXAMPLE 2

In the example 2, the same method as that in the example 1 was conducted except that the basic value of the distance D between the ejection port and the substrate was set to 50 μm. Since D can be kept constant by vertically moving the head 7, the ejection port can approach the substrate as much as possible. For that reason, the precision of the liquid attachment becomes further high, and the excellent image forming apparatus having the more uniform element characteristic than that in the embodiment 1 can be obtained with an improved yield.

EXAMPLE 3

In the system of correcting the variation of the distance between the ejection port and the substrate, the liquid attached position was controlled by changing an ejecting timing on the basis of the variation information of D in the same manner as that in the example 1.

Thereafter, the electron source substrate was manufactured by the same manner as in the example 1, the envelope 88 was formed by the face plate 86, the support frame 82, and the rear plate 81, and sealing is conducted to manufacture a display panel and also an image forming apparatus having a drive circuit for conducting the television display on the basis of a television signal of the NTSC system as shown in FIG. 12.

As a result, the uniform element electrode can be manufactured in the same manner as that in the example 1, thereby being capable of obtaining the excellent image forming apparatus.

EXAMPLE 4

In the example 4, the surface conduction type electron emission element was manufactured to obtain the electron source substrate as in the example 1, except that the substrate wired in matrix (FIG. 3(a)) was manufactured through a screen printing method. By using the obtained electron source substrate, the envelope 88 was formed by the face plate 86, the support frame 82 and the rear plate 81 in the same manner as that in the example 1, and sealing is conducted to manufacture a display panel and also an image forming apparatus having a drive circuit for conducting the television display on the basis of a television signal of the NTSC system as shown in FIG. 12.

As a result, the excellent image forming apparatus could be obtained as in the example 1.

EXAMPLE 5

Figure 15:
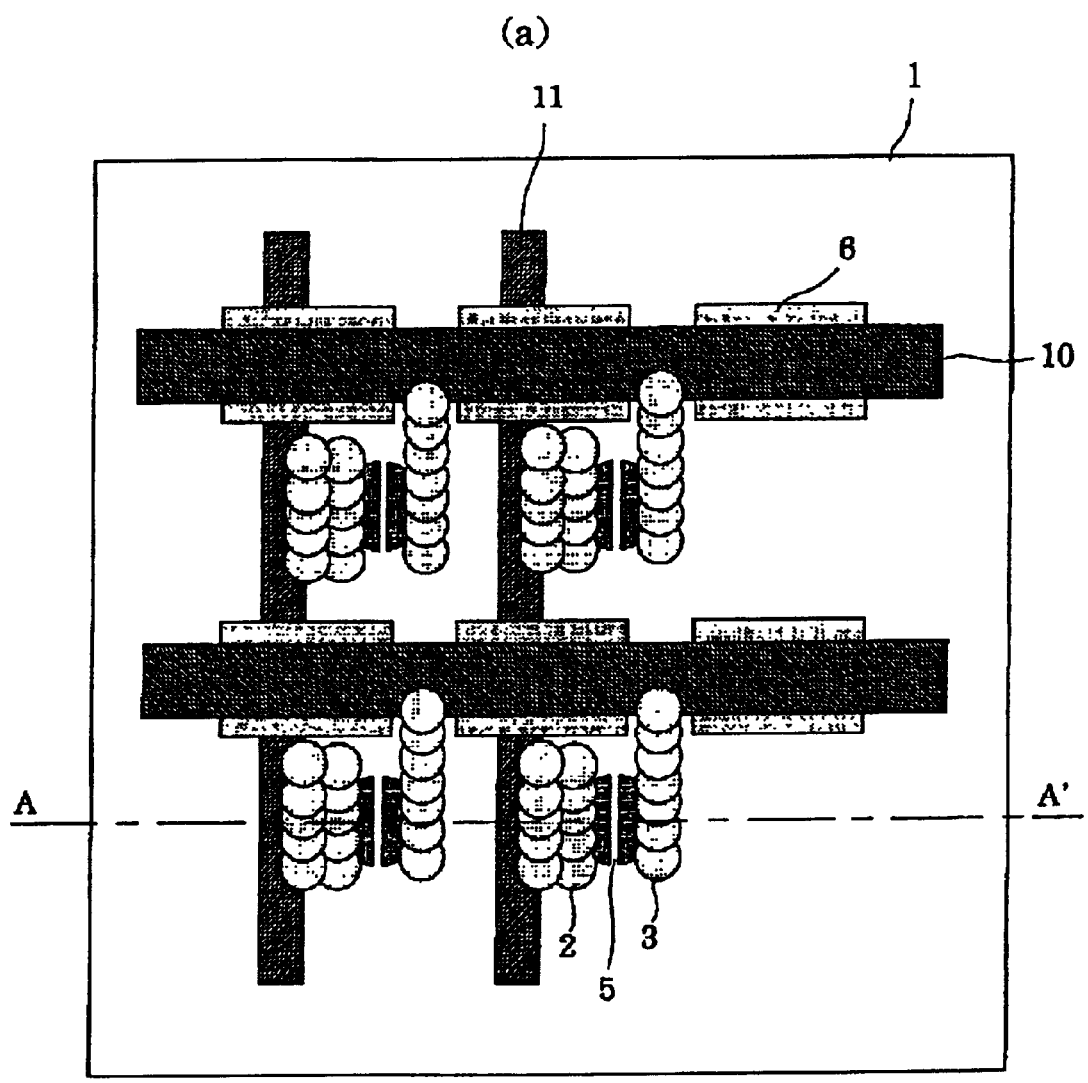
FIG. 15 is a schematic view showing another manufacturing method of an electron source substrate having an electron emission element in accordance with the present invention.
Figure 15:
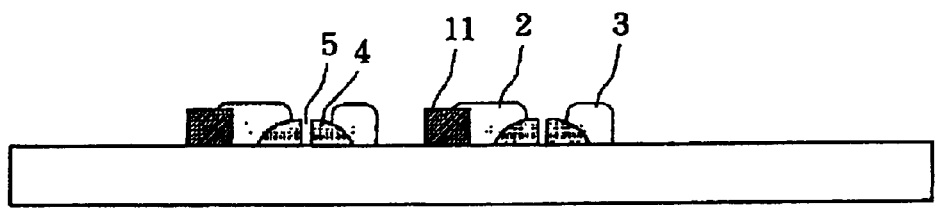

FIG. 15 is a schematic view showing another manufacturing method of an electron source substrate having an electron emission element in accordance with the present invention. FIG. 15(a) is a plan view and FIG. 15(b) is a cross-sectional view taken along a line A–A'.

In FIG. 15, the element electrodes 2 and 3 were manufactured in addition to the electrically conductive film 4 through the following manufacturing method.

Step-a:

A soda lime glass substrate of 900×600 (mm) was used as the insulating substrate 1, and after the glass substrate has been sufficiently cleaned by an organic solvent or the like, it was dried at 120° C. The column wirings 11 made of Ni were formed on the substrate 1 through the screen printing method. The width of the column wirings 11 was set to 300 μm, and its thickness was set to 500 Å. In addition, after the insulating film 6 of 500 Å in thickness was formed on the column wirings 11, the row wirings 10 made of Au were formed similarly. The width of the row wirings 10 was set to 200 μm, and its thickness was set to 5000 Å.

Step-b:

The substrate is adsorbed by the stage 8 of the liquid droplet giving device shown in FIG. 4, and as a result of measuring the distance D between the ejection port and the substrate over the entire surface of the substrate by using the distance measuring sensor 9, a variation of the distance D between the ejection port and the substrate over the entire surface of the substrate was 200 μm.

Step-c:

The basic value of the distance D between the ejection port and the substrate was set to 300 μm, and a droplet 12 of a solution containing a material that forms the electrically conductive film 4 was given while as a variable value over the entire surface of the substrate, D was kept constant by vertically moving the head 7 by the piezo-electric element attached onto the head 7.

The solution as used was an organic paradium solution (aqueous solution of acetic acid Pd-monoethanolamine complex 0.4 wt %, isopropyl alcohol 20%, ethylene glycol 1.0%, and polyvinyl alcohol 0.05%).

In this example, the scanning speed of the stage 8 was set to 500 mm/sec. The ejecting speed of the liquid droplet was set to about 10 m/sec.

Step-d:

In addition, a heat treatment was conducted at 100° C. for 5 minutes.

Step-e:

Subsequently, the basic value of the distance D between the ejection port and the substrate was set to 300 μm, and while as a variable value over the entire surface of the substrate, D was kept constant by vertically moving the head 7 by the piezo-electric element attached onto the head portion, the element electrode 2 was formed on the substrate so as to be connected to the column wirings 11 by using an organic platinum solution (platinum acetic acid-monoethanolamine complex 0.4 wt %, isopropyl alcohol 20%, and water 80%). Thereafter, the element electrode 3 was formed so as to be connected to the row wirings 10 at a position shifted from the element electrode 2 by 120 μm.

In addition, a heat treatment was conducted at 300° C. for 10 minutes, to thereby form the electrically conductive film 4 made of paradium oxide (PdO) fine particles 100 Å in thickness, and the element electrodes 2 and 3 made of Pt. The element electrodes 2 and 3 were separated from each other by a gap L of 20 μm, and have width W of 310 μm thickness of 300 Å.

Step-g:

Then, a voltage was applied between the element electrodes 2 and 3 and the electrifying process was conducted on the electrically conductive film 4 (electrification forming), to thereby form the fissure 5 in the electrically conductive film 4.

By using the electron source substrate thus manufactured, the envelope 88 was formed by the face plate 86, the support frame 82 and the rear plate 81 as shown in FIG. 10, and sealing is conducted to manufacture a display panel and also an image forming apparatus having a drive circuit for conducting the television display on the basis of a television signal of the NTSC system as shown in FIG. 12.

As a result, the excellent image forming apparatus could be obtained as in the example 1.

EXAMPLE 6

Figure 16:
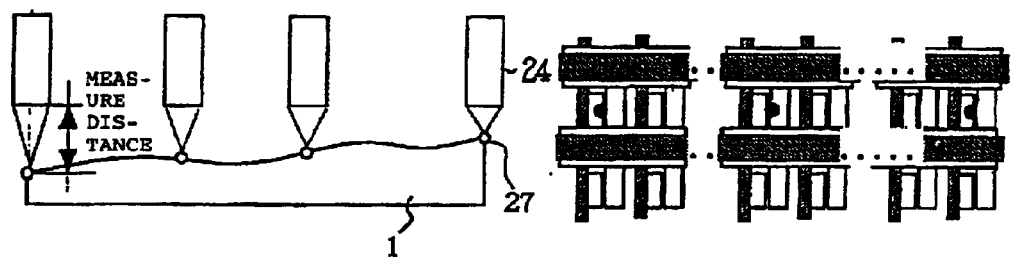
FIG. 16 is a schematic view showing a process of manufacturing an electron source substrate in accordance with a sixth embodiment.
Figure 16:
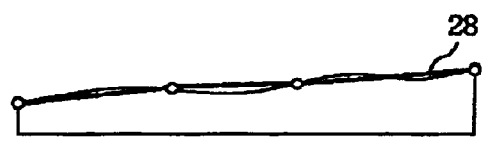
Figure 16:
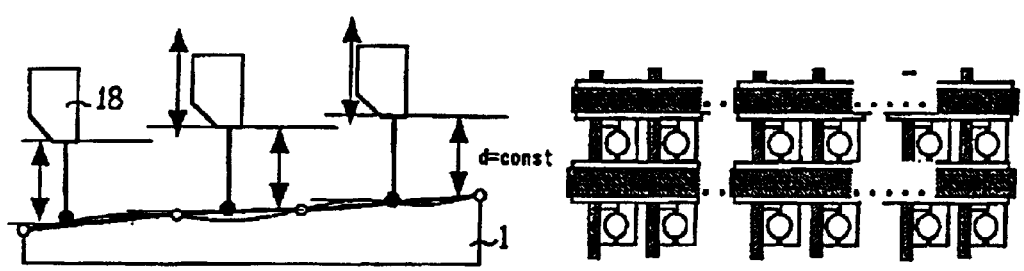
Figure 17:
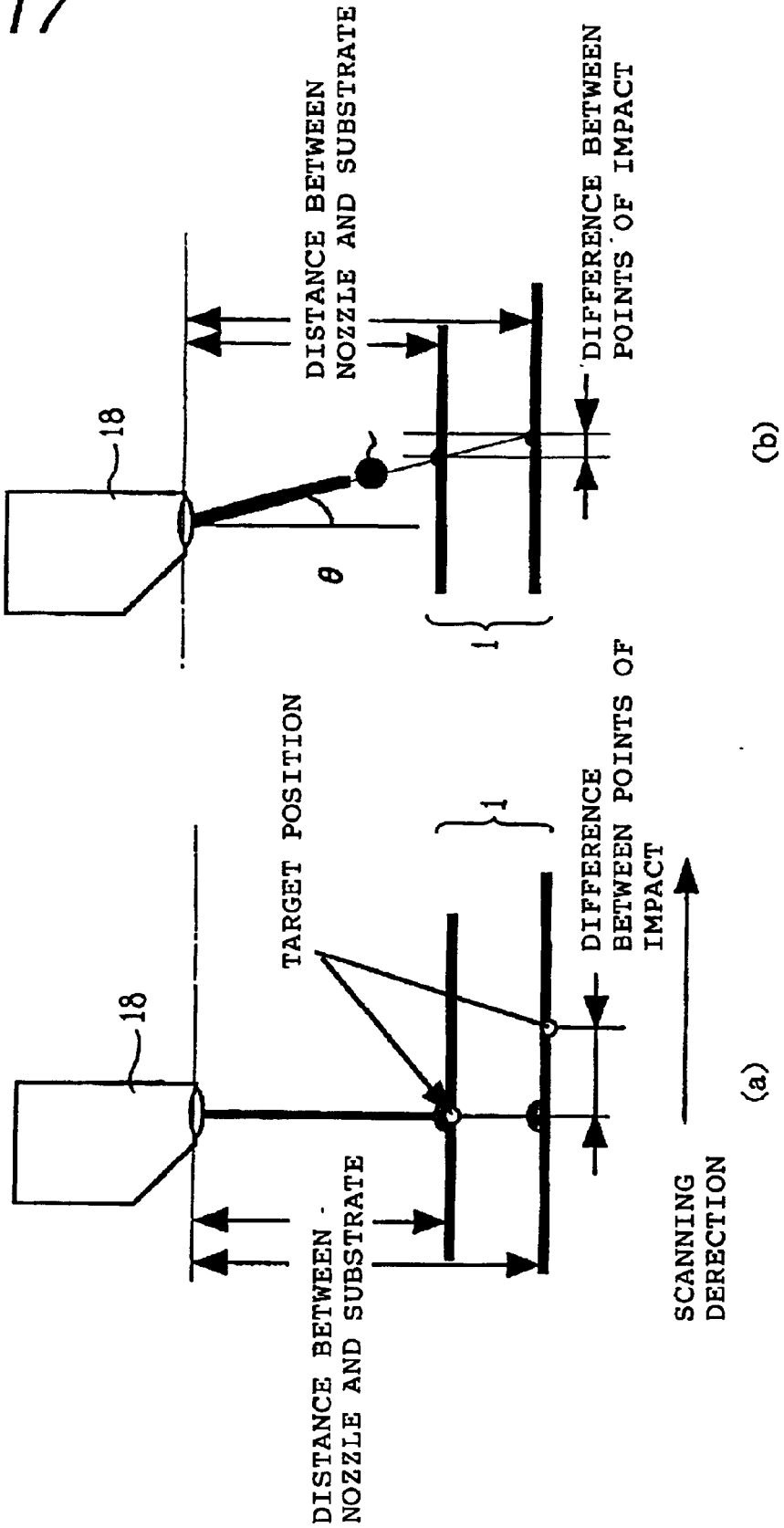
FIG. 17 is a diagram showing the displacement of a droplet landing position which is caused by a distance between the droplet giving device and the substrate.

FIG. 7 is a schematic view showing a device for manufacturing an electron source substrate in accordance with this example. FIG. 9 is a schematically enlarged structural view showing a liquid droplet giving device in FIG. 7. Also, FIG. 16 is a schematic view showing a process of manufacturing an electron source substrate in accordance with this example. Hereinafter, the device structure and a method of manufacturing an electron source substrate by using the device will be described.

First, in FIG. 7, reference numeral 25 denotes a stage on which the substrate 1 on which the electron source is formed is fixedly mounted. The stage 25 is coupled to the X- and Y-direction scanning mechanism which is moved in X- and Y-directions and moves in accordance with a signal from a stage scanning controller 26. The electron source having a plurality of surface conduction type electron emission elements which is formed on the substrate 1 is identical in structure with that shown in FIG. 3, and the surface conduction type electron emission elements include the element electrodes 2, 3 and the electrically conductive film 4 as in FIG. 1.

A distance measuring device 24 is located above the substrate 1, and the liquid droplet giving device 18 is further situated. In this example, the liquid droplet giving device 18 is fixed onto the main body device in the X- and Y-plane direction, and the substrate 1 which faces the liquid droplet giving device 18 is moved to an arbitrary position by the stage 25 coupled to the X- and Y-direction scanning mechanism, to thereby realize the X- and Y-direction relative movement between the liquid droplet giving device 18 and the substrate 1.

On the other hand, the relative position between the nozzle tip surface that ejects the liquid droplet of the liquid droplet giving device 18 and the laser outgoing hole of the distance measuring device 24 in the Z-direction is obtained when the device is designed.

The distance measuring device 24 as used is of the laser interference type, and an absolute distance between the laser outgoing hole of the distance measuring device and the substrate 1 immediately below the laser outgoing hole is measured on the basis of the reflected light from the substrate 1.

Subsequently, the structure of the liquid droplet giving device 18 will be described with reference to FIG. 9. The liquid droplet giving device 18 that gives the liquid droplet 12 to the substrate 1 is connected to the main body device through a head alignment vertical fine moving mechanism 20 so as to be movable vertically (Z-direction) with a precision. The vertical fine moving mechanism 20 is made up of a piezo-electric element which is driven in the Z-direction and a mechanism that enlarges a displacement of the piezo-electric element and is designed so as to be movable in the direction with a precision. Also, a stroke of about 200 μm is provided by a displacement enlarging mechanism.

Also, the drive of the liquid droplet giving device 18 is controlled by a control/drive device 28, thereby being capable of ejecting a liquid droplet from the liquid droplet giving device 18 at an arbitrary timing, and the control/drive device of the liquid droplet giving device 18 is controlled by a computer 29 for control. The liquid droplet giving device is of the piezo-electric jet system.

A method of manufacturing the electron source substrate using the present device will be described with reference to FIGS. 7 to 9 and 16 to 18.

After the insulating substrate 1 has been sufficiently cleaned, it was dried at 120° C. A pair of element electrodes 2 and 3 made of Pt with electrode gaps of 20 μm were formed on the substrate 1 in matrix through a vacuum film forming technique and a photolithgraphy technique. Thereafter, the row wirings 10, the column wirings 11 for applying a voltage to the element electrodes and the insulating layer 6 were formed through the screen printing method (refer to FIG. 18).

As shown in FIGS. 7 and 17(a), the substrate 1 fixed onto the stage 25 is continuously scanned in the X- and Y-directions, and when the substrate 1 reaches a desired position, the liquid droplet 12 is ejected from the ink jet 18, to thereby give the liquid droplet 12 that will form the electrically conductive film to a desired position on the element electrodes 2 and 3. In this situation, if an interval between the nozzle tip surface from which the liquid droplet 12 is ejected and the substrate to which the liquid droplet is given is different, because a period of time since the ejection starts until the liquid droplet reaches the substrate is different, the position on the substrate to which the liquid droplet is given is shifted as shown in FIG. 17(a).

Also, as shown in FIG. 17(b), if the liquid droplet is ejected with an unsure angle Θ with respect to the normal direction due to an error in manufacturing the liquid droplet giving device 18 or an error in mounting the device, the position on the substrate to which the liquid droplet is given is shifted by an interval between the nozzle tip surface from which the liquid droplet 9 is ejected and the substrate to which the liquid droplet is given.

Figure 18:
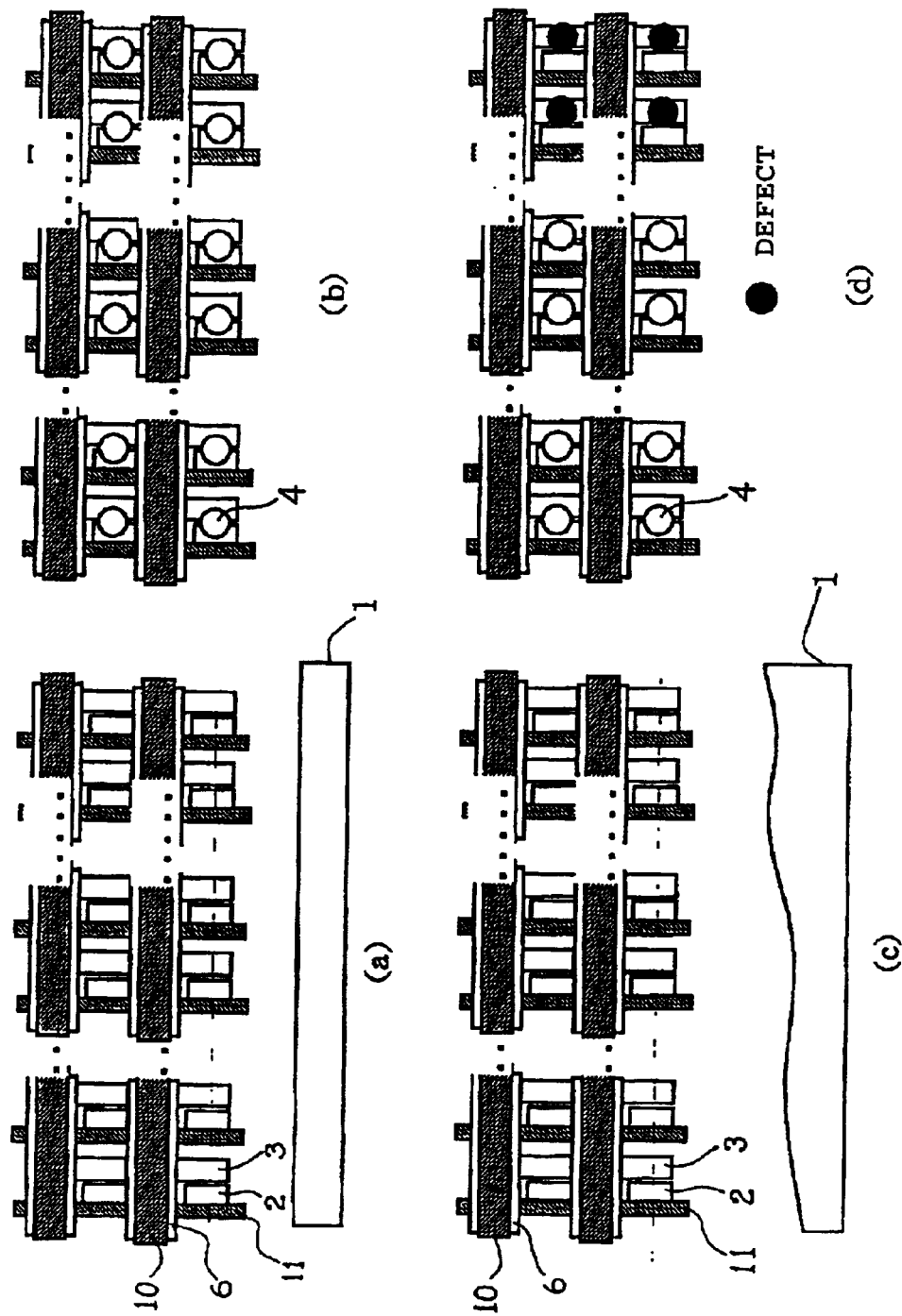
FIG. 18 is a diagram showing the displacement of a droplet landing position which is caused by the distribution of the thickness of the substrate.

In giving the liquid droplet, in the case where the substrate 1 has a constant thickness as designed, and the flatness of the stage 25 and the parallel degree when the stage 25 is scanned are kept (FIG. 18(a)), the table 25 on which the substrate is mounted is scanned by the X, Y scanning mechanism at a constant speed, and the liquid droplet is ejected by the control/drive mechanism 28 of the liquid droplet giving device 18 with a constant period in synchronism with the scanning operation, thereby being capable of giving the liquid droplet to a given position over the entire surface of the substrate 1 (FIG. 18(*b*)).

However, in fact, there is the most cases in which because the substrate 1 has the distribution of the thickness from the beginning, or the entire substrate is deformed by heat, etc., during the substrate manufacturing process, the electron emission elements are manufactured such that the thicknesses of the substrate on the respective locations are different from the designed thickness as shown in FIG. 18(*c*). Also, there are many cases in which the parallel degree of the stage and the flatness of scanning are not frequently ensured. In particular, the distribution of the thickness of the substrate is different between the respective portions of the same substrate and between the respective substrates. When the liquid droplet 12 is given to such a substrate in the same manner as that as described above, because the position on the substrate to which the liquid droplet is given is different in accordance with the distance between the head and the substrate on that location, the liquid droplet is not given as designed. Accordingly, the electrically conductive film is not formed as designed, resulting in such a defect that the substrate does not sufficiently function as the electron source substrate (FIG. 18(*d*)). This causes the deterioration of the yield.

This example solves the above problem through the following procedure. The procedure will be described with reference to a flowchart shown in FIG. 8 and FIG. 16.

Step 1)

In the element electrode pair at the designated coordinates on the substrate 1 having the thickness distribution as shown in FIG. 16(*a*), a distance between the distance measuring device 24 fixed within the device and a portion 27 which forms the electrically conductive film on which the electron emission portion is formed in the Z-direction is detected (FIG. 16(*a*)). There are various manners for detecting the distance, but in this example, CS-902a having a laser interferometer made by Keyence Corp. was employed.

Step 2)

The positions of the designated portions on the substrate in the Z-direction were detected through the method shown in the above step 1). In the steps 1) and 2), the position and the number of the element electrode pairs which obtain the positional information are 4×4=16 points in total which includes 4 points at four corners of the substrate, four points at substantially the regular intervals in the X-direction and four points at substantially the regular intervals in the Y-direction, as shown in FIG. 7.

Step 3)

A topology diagram connecting the adjacent element electrodes by straight lines is prepared from the positional information obtained in the above steps 1) and 2) (FIG. 16(*b*)). Then, assuming that other element electrode pairs which do not detect the position on the substrate 1 in the Z-direction are at positions represented by the topology diagram, the position of all the electrode pairs in the Z-direction are obtained.

Step 4)

After the positions on the substrate 1 to which the liquid droplets ejected from the liquid droplet giving device 18 are given have been aligned, the X, Y scanning mechanism and the ink jet control/drive mechanism are continuously scanned in synchronization to give the liquid droplet 12 to the substrate. In this situation, the positional information of all the element electrode pairs on the substrate in the z-direction as obtained in FIG. 16(*b*) is transmitted to the head vertical mechanism 20, and the head is vertically moved so that the interval between the nozzle tip surface and the detected or calculated droplet given position on the substrate surface is always kept constant.

In the above way, the liquid droplet containing the material that forms the electrically conductive film is given for each of the electrode pairs 4 times in total, and a heat treatment was then conducted at 300° C. for 10 minutes, to thereby form a thin film made of paradium oxide (PdO) 100 Å in thickness as the electrically conductive film.

Then, a voltage was applied between the element electrodes 2 and 3 and the electrifying process was conducted on the electrically conductive film 4 (electrification forming), to thereby form the fissure 5 in the electrically conductive film 4.

By using the electron source substrate thus manufactured, the envelope 88 was formed by the face plate 86, the support frame 82 and the rear plate 81 as shown in FIG. 10, and sealing is conducted to manufacture a display panel and also an image forming apparatus having a drive circuit for conducting the television display on the basis of a television signal of the NTSC system.

The electron emission element manufactured through the manufacturing method according to the present invention as described has been formed not only with an excellent characteristic but also with the electrically conductive film being uniform and excellent within the substrate. Also, in this example, with only the addition of a very short process period such as the above positional information of 16 points and the connection of those points by straight lines, there could be obtained an excellent image forming apparatus with an improved yield and with a small variation of the element characteristic to the same degree as that manufactured through the photolithgraphy technique.

In the device described in this example, the number of dots for obtaining the topology diagram can be adapted to an arbitrary number in accordance with the deformed state of the substrate. In this example, reference is given to 16 points for obtaining the topology diagram shown in FIG. 16(*b*), but if the number of points is increased, the deformed amount of the actual substrate can be accurately represented, thereby being capable of further improving the yield.

EXAMPLE 7

A method of manufacturing the image forming apparatus having the surface conduction type electron emission elements in accordance with an example 7 will be described with reference to FIG. 15. This example is entirely identical with the example 6 except that the liquid droplet containing the material that forms the element electrodes 2 and 3 is given to the substrate to manufacture the element electrodes 2 and 3.

According to the manner of forming even the element electrodes 2 and 3 by giving the liquid droplet as in this example, the electron source substrate lower in the costs can be provided. In addition, in this example, with the application of the same liquid droplet giving device as that in the example 6, the liquid droplet can be given to a desired position even on the substrate uneven in thickness. By using the electron source substrate thus obtained, the envelope 88 was formed by the face plate 86, the support frame 82 and the rear plate 81 in the same manner as that in the example 6, and sealing is conducted to manufacture a display panel and also an image forming apparatus having a drive circuit for conducting the television display on the basis of a television signal of the NTSC system. As a result, there could be obtained an excellent image forming apparatus as in the embodiment 6. Similarly, in this example, it is possible to obtain a more stable image forming apparatus.

EXAMPLE 8

A method of manufacturing the image forming apparatus having the surface conduction type electron emission elements in accordance with an example 8 will be described. This example is entirely identical with the example 6 except that the distance measuring device is made up of a system having a focusing function including a CCD camera, a microscope and an image processing device.

Figure 19:
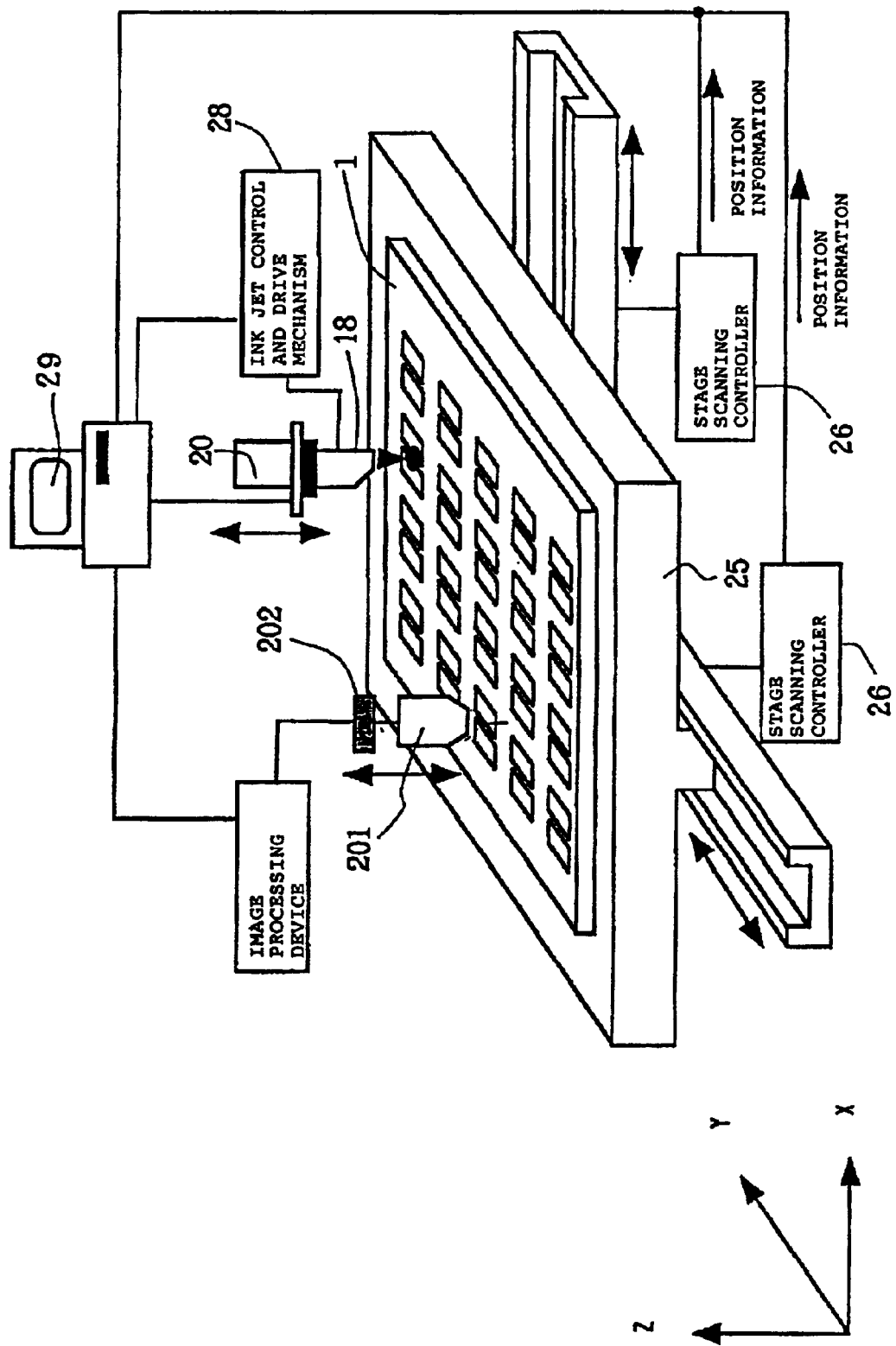
FIG. 19 is a diagram entirely showing a device for manufacturing an electron source substrate.
Figure 20:
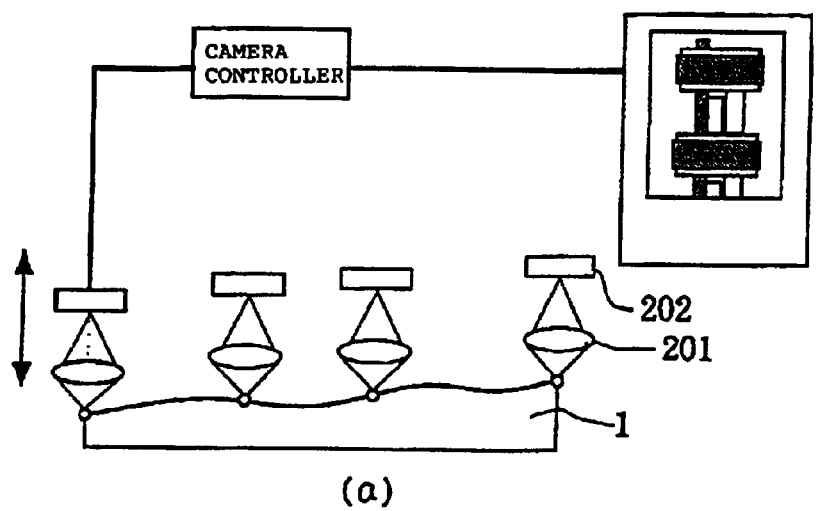
FIG. 20 is a diagram for explaining the operation of a device for manufacturing an electron source substrate in accordance with an eighth embodiment.
Figure 20:
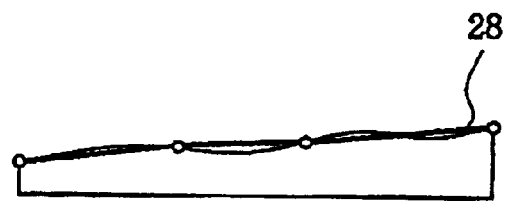
Figure 20:
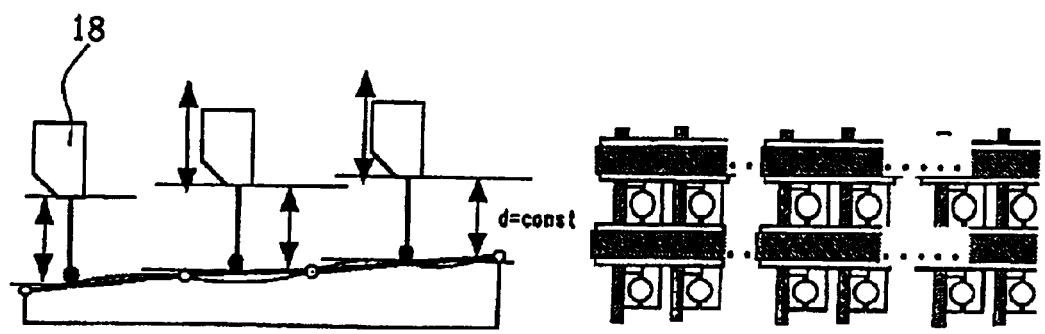

FIG. 19 is a diagram entirely showing a device for manufacturing an electron source, and FIG. 20 is a partially enlarged diagram of the device. Hereinafter, the device structure and a method of manufacturing an electron source substrate by using the device will be described.

In the same manner as that in the example 6, the substrate 1 is moved to a position where the element electrode pair of the designated reference can be observed by a microscope 201 and a CCD camera 202. Then, the microscope 201 and the CCD camera 202 are moved in the Z-direction, and focusing is made so that an image of the element imaged on the CCD camera becomes most clear. In this situation, the position between the designated element electrode pair in the Z-direction is detected on the basis of the position of the microscope in the Z-direction. The subsequent steps are perfectly identical with those in the example 6.

By using this method, the position between the designated element electrodes can be detected with a high precision, and also an error in distance measurement due to the roughness of the substrate surface can be prevented. When the electron source substrate is manufactured by using the device according to this embodiment, the yield can be improved as in the example 6.

EXAMPLE 9

A method of manufacturing the image forming apparatus having the surface conduction type electron emission elements in accordance with an example 9 will be described. This example is entirely identical with the example 6 except that the adjustment of the distance between the head and the substrate is realized by vertically moving the stage 25.

Figure 21:
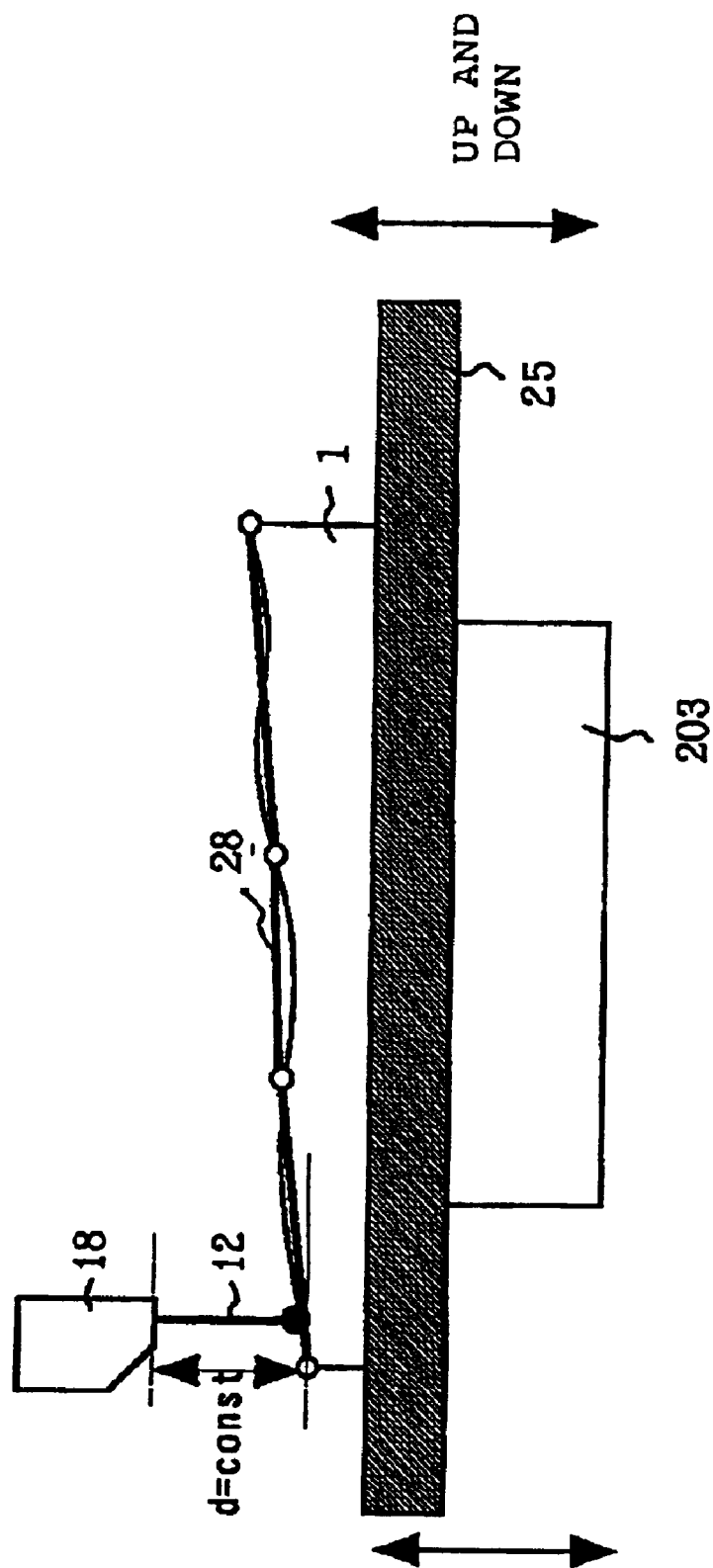
FIG. 21 is a diagram for explaining the operation of a device for manufacturing an electron source substrate in accordance with a ninth embodiment.

FIG. 21 is a partially structural diagram showing a manufacturing device in accordance with this example. Hereinafter, the device structure and a method of manufacturing an electron source substrate by using the device will be described.

In the same manner as in the example 6, after the position on the entire surface of the substrate 1 in the Z-direction has been calculated on the basis of the position of a reference point between the designated element electrode pairs in the Z-direction, the calculated value is transmitted to a stage vertical mechanism 203 disposed below the stage 25, to thereby vertically move the stage 25, thus making the distance between the head and the substrate constant.

By using this method, since the distance between the substrate 1 and the head unit 18 can be kept constant while the head unit 18 is fixed, the ejection of the liquid droplet is more stabilized without propagating the fine vibration to the head when the head vertically moves. Similarly, in this example, the yield could be improved as in the example 6.

EXAMPLE 10

A method of manufacturing the image forming apparatus having the surface conduction type electron emission elements in accordance with an example 10 will be described. This example is entirely identical with the example 6 except that the adjustment of the distance between the head and the substrate is realized by tilting the entire stage 25.

Figure 22:
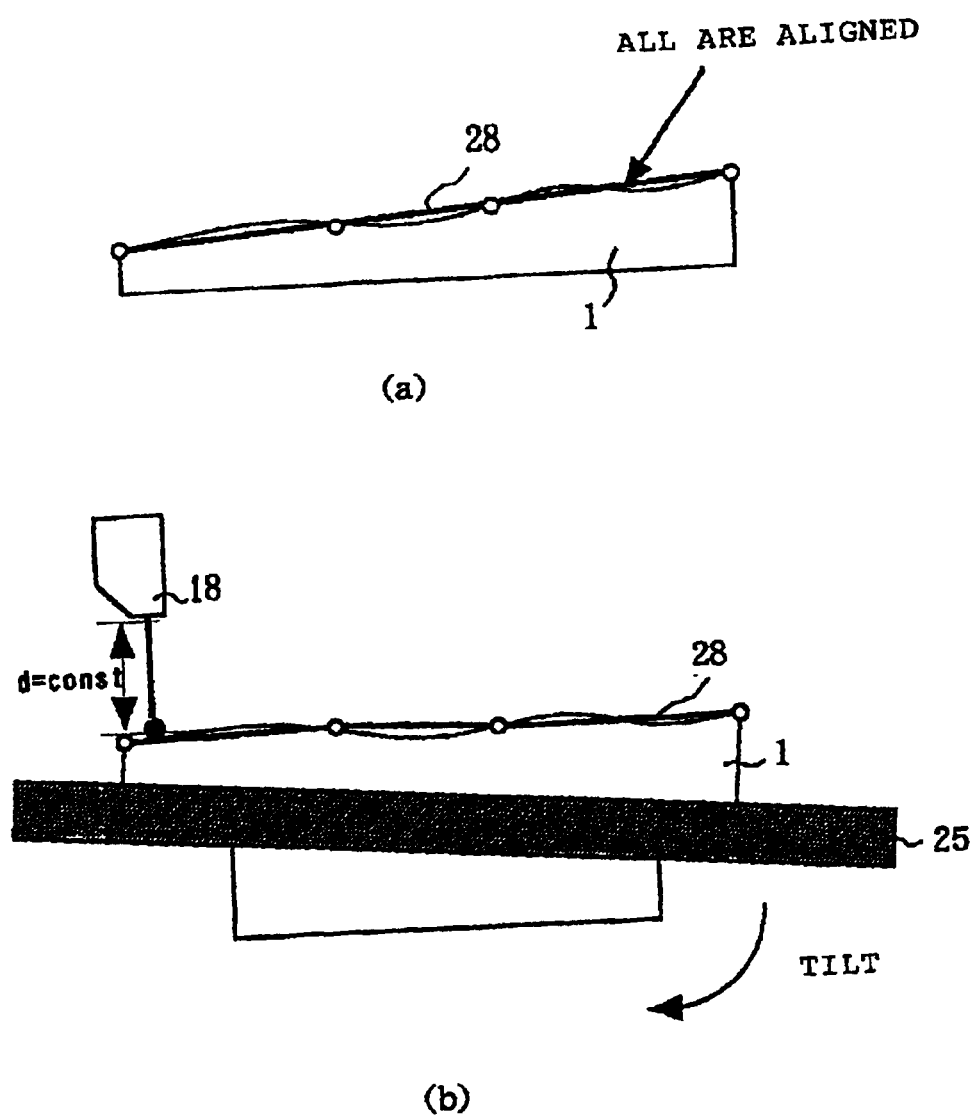
FIG. 22 is a diagram for explaining the operation of a device for manufacturing an electron source substrate in accordance with a tenth embodiment.

FIG. 22 is a partially structural diagram showing a manufacturing device in accordance with this example. Hereinafter, the device structure and a method of manufacturing an electron source substrate by using the device will be described.

In the same manner as that in the example 6, in the case where the position on the entire surface of the substrate 1 in the z-direction has been calculated on the basis of the position of a reference point between the designated element electrode pairs in the z-direction, when the steps are optimized, there are many cases in which in the deformation high in spatial frequency is relatively small in the amount of deformation, and the unevenness of the substrate thickness does not affect the manufacturing precision. However, there is a case in which the deformation over the entire surface of the substrate is almost observed when the amount of deformation cannot be ignored, and its configuration is represented by one-dimension (straight line) (from the feature of the glass substrate manufacturing process) (FIG. 22(a)). In such a case, the head unit 18 and the stage are not vertically moved as in the embodiments 6 to 9, but the stage is inclined along the deformation of the substrate as shown in FIG. 22(b), thereby being capable of making the distance between the head and the substrate constant.

By using this method, since the distance between the substrate 1 and the head unit 18 can be kept constant while the head unit 18 and the stage 25 are fixed, the ejection of the liquid droplet is more stabilized without propagating the fine vibration to the head when the head vertically moves. Also, the scale of the entire device can be downsized, and the yield could be improved as in the example 6.

EXAMPLE 11

A method of manufacturing the image forming apparatus having the surface conduction type electron emission elements in accordance with an example 11 will be described with reference to FIG. 23. This example is entirely identical with the example 6 except that the topology diagram that obtains the position on the substrate to which the liquid droplet is given is obtained by the positional information between the electrode pairs at four corners of the substrate and by connecting one point between the electrode pairs by a two-dimensional curve.

Figure 23:
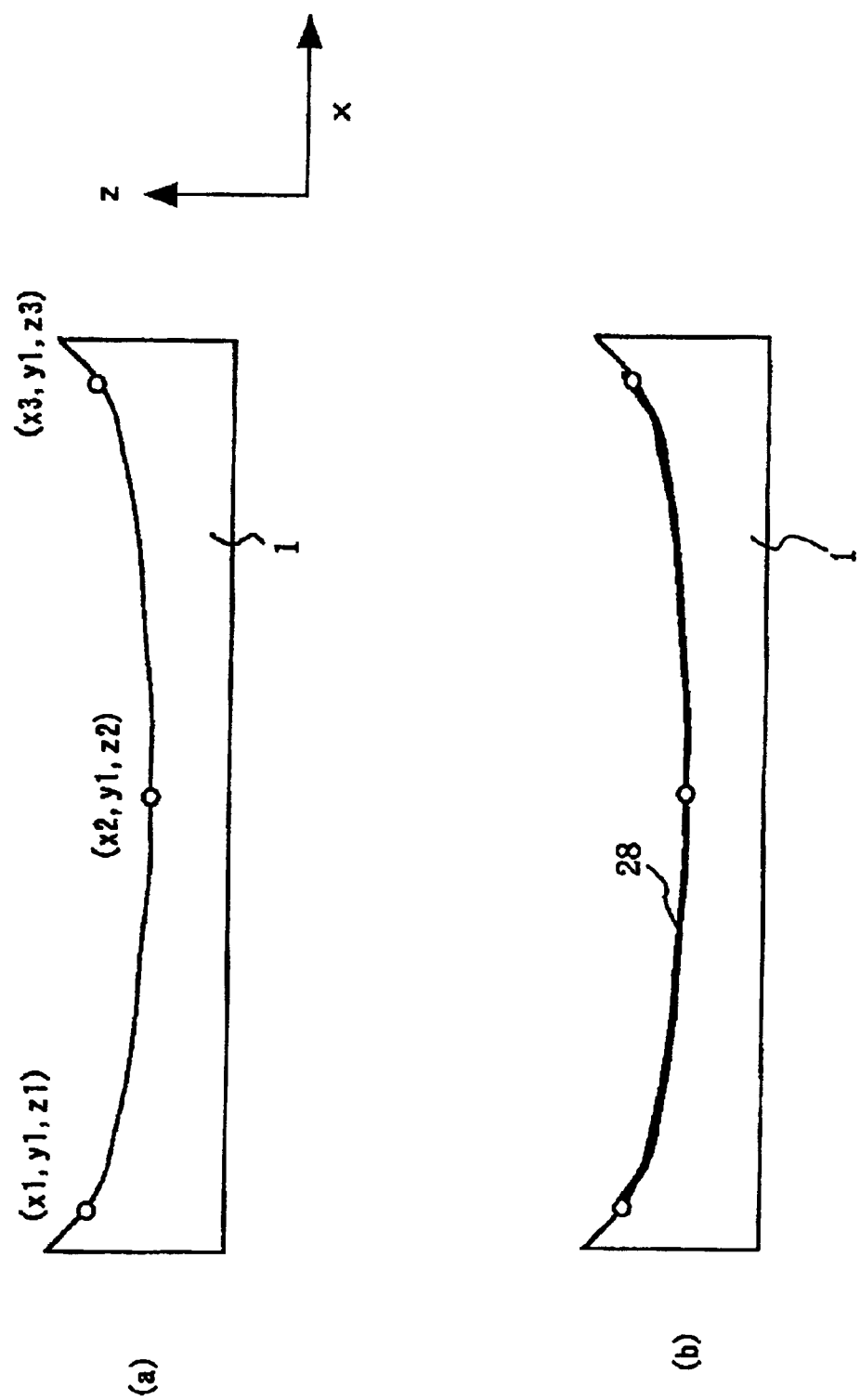
FIG. 23 is a diagram for explaining the operation of a device for manufacturing an electron source substrate in accordance with an eleventh embodiment.

In the case where the deformation of the substrate is more effectively represented by multi-dimensional curve as shown in FIG. 23, the connection of the respective points in the topology diagram is not always expressed by straight lines, but there are many cases in which the actual amount of deformation of the substrate is accurately expressed when the connection is expressed by multi-dimensional curve. In this example, the connection is expressed by two-dimensional curve, to thereby reduce the number of points to which the liquid droplet is given in a specific element electrode pair which obtains a position through an image processing in advance, thus shortening the process.

Hereinafter, an implementing procedure of this example will be described.

Step 1)

The X, Y and Z positional information of 9 points in total including four corners of the substrate and 1 point between the respective points is detected in accordance with the above-described manner. It is assumed that the respective points are (xm, ym, zn (m=1 to 3, n=1 to 9).

Step 2)

In the positional information of the three adjacent points among the points measured in the above step 1), in this example, (x1, y1, z1), (x2, y1, z2) and (x3, y1, z3), a, b and c which satisfy the following expressions are obtained.

$$a \cdot x1^2 + b \cdot x1 + c = z1$$

$$a \cdot x2^2 + b \cdot x2 + c = z2$$

$$a \cdot x3^2 + b \cdot x3 + c = z3$$

Step 3)

The positional information (x, y1, z) between 3 points represented in the step 2) is supplemented on the basis of the above values a, b and c so as to satisfy $$a \cdot x^2 + b \cdot x + c = z$$

Step 4)

The above steps 2) and 3) are conducted among all the points having the adjacent relationship, and the positional information of the entire surface of the substrate is obtained to prepare the topology diagram.

As described above, the method of preparing the topology diagram in this example is reviewed and optimized every time the manufacturing method of the wiring, etc. is changed, thereby being capable of realizing a further improvement in the yield and a reduction in the tact.

EXAMPLE 12

Figure 24:
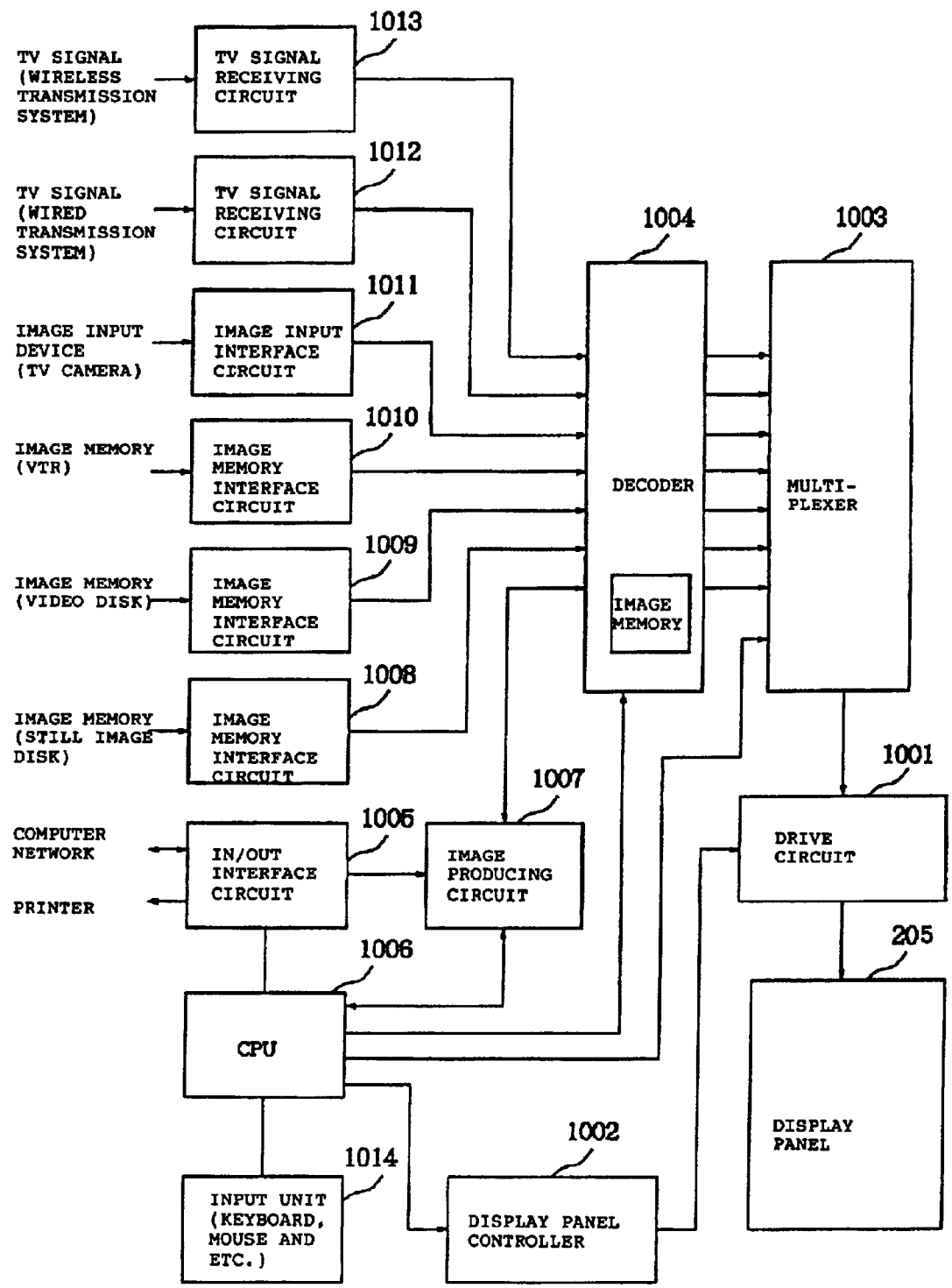
FIG. 24 is a block diagram showing an image display device in accordance with a twelfth embodiment.
Figure 25:
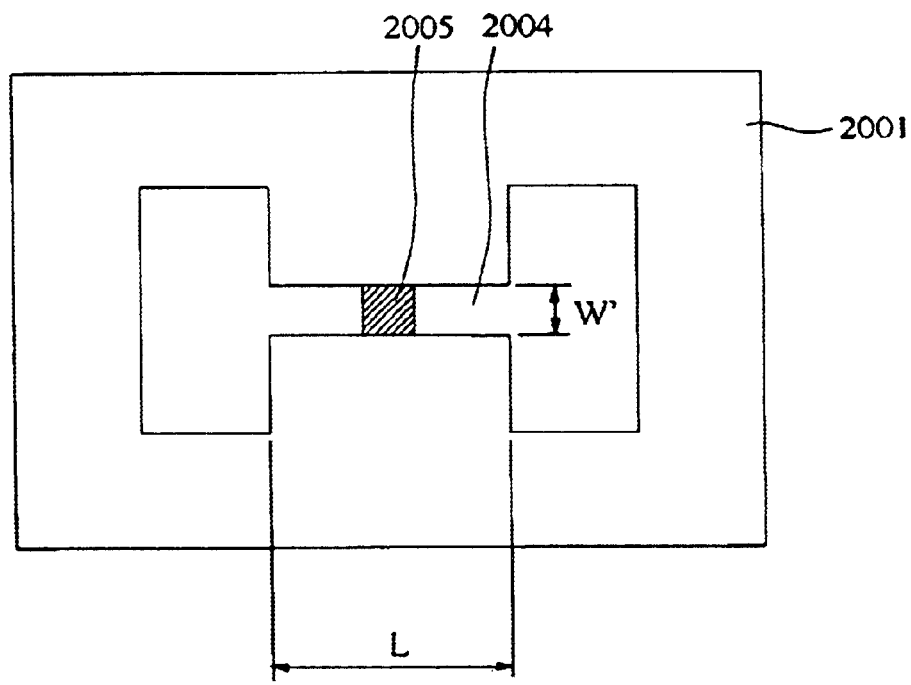
FIG. 25 is a schematic view showing a conventional surface conduction type electron emission element.
Figure 26:
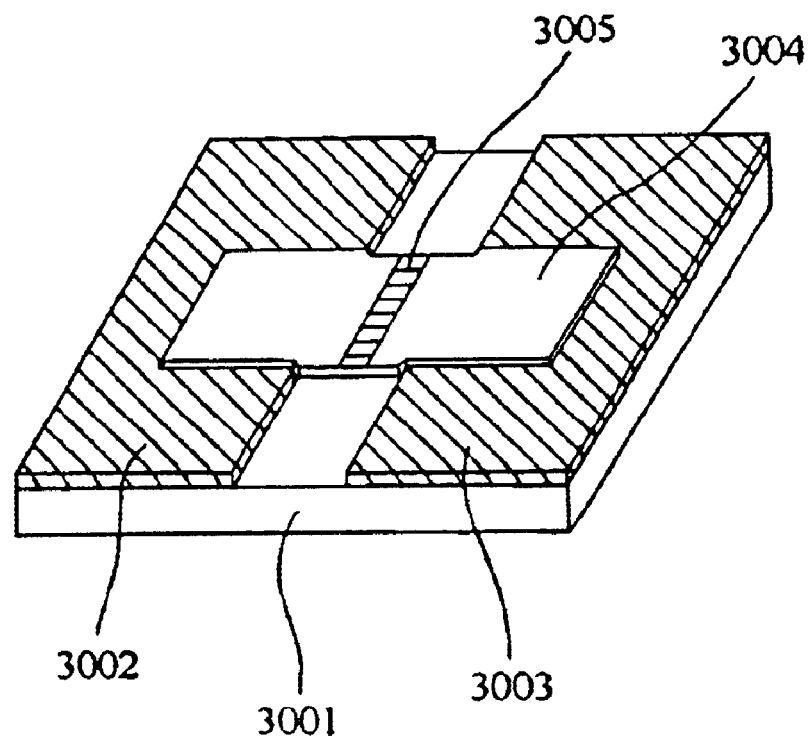
FIG. 26 is a schematic view showing another conventional surface conduction type electron emission element.

FIG. 24 is a diagram showing one example of an image forming apparatus structured in such a manner that image information supplied from various image information source, for example, television broadcast, can be displayed on a display panel (FIG. 10) manufactured in the above-described respective examples.

In the figure, reference numeral 205 denotes a display panel, 1001 is a drive circuit of the display panel, 1002 is a display controller, 1003 is a multiplexer, 1004 is a decoder, 1005 is an input/output interface circuit, 1006 is a CPU, 1007 is an image generating circuit, 1008, 1009 and 1010 are image memory interface circuits, 1011 is an image input interface circuit, 1012 and 1013 are TV signal receiving circuits, and 1014 is an input portion.

The present image forming apparatus displays a video information and reproduces an audio information when the apparatus receives a signal including both of the video information and the audio information, for example, as with a television signal. However, circuits pertaining to the reception, separation, reproduction, processing, storage, etc. of the audio information, a speaker and so on which are not directly concerned with the features of the present invention will be omitted from description.

Hereinafter, the functions of the respective parts will be described along a flow of the image signal.

First, the TV signal receiving circuit 1013 is a circuit for receiving a TV signal transmitted on a radio transmission system such as electric waves or spatial optic communication.

The system of the received TV signal is not particularly limited, but any system of the NTSC system, the PAL system, the SECAM system and so on may be applied. Also, a so-called high-grade TV of a TV signal having a larger number of scanning lines than those systems, for example, a MUSE system is a proper signal source for exhibiting the advantage of the above-described display panel suitable for a large area or a large number of pixels.

The TV signal received by TV signal receiving circuit 1013 is outputted to the decoder 1004.

The TV signal receiving circuit 1012 is a circuit for receiving the TV signal transmitted on the wire transmitting system such as a coaxial cable or an optical fiber.

As in the above TV signal receiving circuit 1013, the system of the received TV signal is not particularly limited. Also, the TV signal received by this circuit is outputted to the decoder 1004.

The image input interface circuit 1011 is a circuit for taking in an image signal supplied from an image input device such as a TV camera or an image reading scanner, and the taken-in image signal is outputted to the decoder 1004.

The image memory interface circuit 1010 is a circuit for taking in an image signal stored in a video tape recorder (hereinafter referred to as "VTR"), and the taken-in image signal is outputted o the decoder 1004.

The image memory interface circuit 1009 is a circuit for taking in an image signal stored in a video disc, and the taken-in image signal is outputted to the decoder 1004.

The image memory interface circuit 1008 is a circuit for taking in an image signal from a device that stores still image data as in a still image disc, and the taken-in image signal is outputted to the decoder 1004.

The input/output interface circuit 1005 is a circuit for connecting the present display device to an output device such as an external computer, a computer network or a printer. The input/output interface circuit 1005 conducts the input/output of image data or character/graphic information and also can conduct the input/output of a control signal or numerical data between the CPU 1006 provided in the present image forming apparatus and the external as occasion demands.

The image generating circuit 1007 is a circuit for generating image data for display on the basis of image data or character/graphic information inputted from the external through the input/output interface circuit 1005 or image data or character/graphic information outputted from the CPU 1006. The interior of the image generating circuit 1007 is equipped with circuits necessary for generating the image, such as a rewritable memory for storing, for example, the image data and the character/graphic information, a read only memory in which an image pattern corresponding to character codes is stored, a processor for conducting image processing, etc.

The image data for display generated by the image generating circuit 1007 is outputted to the decoder 1004, and can be outputted to the external computer network or the printer through the input/output interface circuit 1005 as occasion demands.

The CPU 1006 mainly conducts the operation control of the present display device, and work pertaining to the generation, selection or edition of the display image.

For example, the control signal is outputted to the multiplexer 1003, and the image signal displayed on the display panel is appropriately selected or combined. In this case, the control signal is generated with respect to the display panel controller 1002 in response to the image signal to be displayed, and the operation of the display device such as a screen display frequency, a scanning method (for example, interlace or non-interlace) or the number of scanning lines for one screen is appropriately controlled. Also, the image data or the character/graphic information is directly outputted to the image generating circuit 1007, or the external computer or the memory is accessed through the input/output interface circuit 1005 to input the image data or the character/graphic information.

The CPU 1006 may pertain to the works for other purposes. For example, the CPU 1006 may be directly concerned with a function of generating or processing the information as in a personal computer, a word processor, etc. Also, as described above, the CPU 1006 may be connected to the external computer network through the input/output interface circuit 1005, and cooperates with the external device in works such as numerical calculation.

The input portion 1014 is so designed as to input a command, program or data to the CPU 1006 by a user. For example, various input devices such as a keyboard, a mouse, a joy stick, a bar code reader, or a voice recognizing device can be used.

The decoder 1004 is a circuit for reversely converting various image signals inputted from the above devices 1007 to 1013 into a three primary color signal, or a luminance signal and an I signal, and a Q signal. As shown in the figure, it is desirable that the decoder 1004 includes an image memory therein. This is to deal with the television signal that requires the image memory in reverse conversion as in, for example, the MUSE system.

With the provision of the image memory, the display of the still image is facilitated. Also, there are advantageous in that the image memory facilitates the image processing and edition such as an image thinning, interpolation, enlargement, reduction or composition in cooperation with the image generating circuit 1007 and the CPU 1006.

The multiplexer 1003 is so designed as to appropriately select the display image on the basis of the control signal inputted from the CPU 1006. That is, the multiplexer 1003 selects a desired image signal from the reversely converted image signals inputted from the decoder 1004 to output the selected image signal to the drive circuit 1001. In this case, if the image signal is changed over and selected within a display period of one screen, one screen is divided into a plurality of areas so that different images can be displayed on each area as in a so-called multi-screen television.

The display panel controller 1002 is a circuit for controlling the operation of the drive circuit 1001 on the basis of the control signal inputted from the above CPU 1006.

As the basic operation of the display panel, for example, a signal for controlling the operating sequence of a power supply (not shown) for driving the display panel is outputted to the drive circuit 1001. As the method of driving the display panel, for example, a signal for controlling the screen display frequency or the scanning method (for example, interlace or non-interlace) is outputted to the drive circuit 1001. Also, as occasion demands, a control signal pertaining to the adjustment of an image quality such as the luminance, the contrast, the tone or the sharpness of a display image is outputted to the drive circuit 1001.

The drive circuit 1001 is a circuit for generating a drive signal applied to the display panel 205 and operates on the basis of an image signal inputted from the multiplexer 1003 and a control signal inputted from the display panel controller 1002.

The above description was given of the functions of the respective parts. With the structure shown in FIG. 24, the present image forming apparatus can display the image information inputted from various image information source on the display panel 205. That is, after various image signals such as the television broadcast have been reversely converted by the decoder 1004, those image signals are appropriately selected in the multiplexer 1003 and then inputted to the drive circuit 1001. On the other hand, the display controller 1002 generates a control signal for controlling the operation the drive circuit 1001 in response to the image signal to be displayed. The drive circuit 1001 applies a drive signal to the display panel 205 on the basis of the image signal and the control signal. With this operation, the image is displayed on the display panel 205. These sequential operation is controlled by the CPU 1006 in a generalizing manner.

The present image forming apparatus not only displays the image selected from the image memory included in the decoder 1004 or selected from the image generating circuit 1007 or the image selected from the information, but also can conduct image processing such as enlargement, reduction, rotation, movement, edge emphasis, thinning, interpolation, color conversion, or the conversion of the longitudinal to lateral ratio of an image, or image edition such as composition, erasion, connection, replacement or insertion with respect o the image information to be displayed. Also, although being not described in this example, an exclusive circuit for processing or editing the audio information may be provided as in the above image processing or the image edition.

Accordingly, the present image forming apparatus can provide the functions of the display device for the television broadcast, the terminal device for television conference, the image editing device for dealing with the still image or the moving image, the terminal device of the computer, a business terminal device such as a word processor, a playing machine, together. Therefore, the present image forming apparatus is extremely broad in applied field as industrial or public use.

The display device shown in FIG. 24 can be variously modified on the basis of the technical concept of the present invention. For example, the circuit pertaining to the function unnecessary for the purpose of use may be omitted from the structural elements shown in FIG. 24. Also, conversely, the structural element may be added for the purpose of use. For example, in the case where the present display device is applied as a television phone, it is preferable to add a television camera, an audio microphone, a lighting equipment, a transmit/receive circuit including a modem, etc. to the structural elements.

In the display device according to this example, since it is easy to thin the display panel with the electron emission element as an electron beam source, the width of the display device can be reduced. In addition, because the large-area is realized easily, the luminance is high and the field angle characteristic is also excellent, the image high in attendance feeling and powerful can be displayed with a high visibility. Also, since the electron source having a large number of electron emission elements having the uniform characteristic is used, the color flat television which is very uniform, bright and high in grade as compared with the conventional display device is realized.

Industrial Applicability

The present invention can provide a manufacturing method and a manufacturing device which are capable of forming a member that constitutes an electronic device on desired plural portions of a substrate with a high accuracy.

Also, the present invention can provide a manufacturing method and a manufacturing device which are capable of forming electronic devices on a plurality of substrates with a high reproducibility.

Further, the present invention can provide a manufacturing method and a manufacturing device which are capable of forming a plurality of electronic devices uniform in characteristic on a substrate.

Still further, the present invention can provide a manufacturing method and a manufacturing device which are capable of manufacturing an electron source having a plurality of electron emission elements uniform in electron emission characteristic.

Yet still further, the present invention can provide a manufacturing method and a manufacturing device which are capable of easily manufacturing an electronic device having a uniform characteristic at low costs.

What is claimed is:

1. A method of manufacturing an electronic device, comprising the steps of:

moving, relative to each other, a droplet ejecting portion of an ink jet device and a substrate, to which droplets are to be ejected, in a direction along a droplet-receiving surface of the substrate, and detecting a distance between the droplet ejecting portion and the droplet-receiving surface of the substrate; and ejecting toward a plurality of portions separated mutually on the substrate at plural times at a predetermined time interval the droplets of a liquid containing material for forming the electronic device, wherein the predetermined time interval is controlled based on a result of the detecting, and wherein the detecting of the distance includes a step of measuring the distances between the ejecting portion and the plurality of portions separated mutually on the substrate.

2. A method of manufacturing an electronic device, comprising the steps of:

moving, relative to each other, a droplet ejecting portion of an ink jet device and a substrate, to which droplets are to be ejected, in a direction along a droplet-receiving surface of the substrate, and detecting a distance between the droplet ejecting portion and the droplet-receiving surface of the substrate; and ejecting toward a plurality of portions separated mutually on the substrate at plural times at a predetermined time interval the droplets of a liquid containing material for forming the electronic device, wherein the predetermined time interval is controlled based on a result of the detecting, and wherein the detecting of the distance includes a step of measuring distances between the ejecting portion and some of the plurality of portions separated mutually on the substrate.

3. A method of manufacturing an electronic device as claimed in claim 1 or 2, wherein the ink jet device is of a type that imparts thermal energy to the liquid to produce a bubble, thereby to eject a droplet.

4. A method of manufacturing an electronic device as claimed in claim 1 or 2, wherein the ink jet device is of a type that ejects the droplets by means of a piezo-electric element.

5. A method of manufacturing an electron source, having a plurality of electron-emitting devices, comprising the steps of:

moving, relative to each other, a droplet ejecting portion of an ink jet device and a substrate, to which droplets are to be ejected, in a direction along a droplet-receiving surface of the substrate;

detecting a distance between the droplet ejecting portion and the droplet-receiving surface of the substrate; and ejecting to a plurality of portions separated mutually on the substrate at plural times at a predetermined time interval the droplets of a liquid containing material for forming a conductive member of the electron-emitting devices, wherein the predetermined time interval is determined based on a result of the detecting, and wherein the detecting of the distance includes a step of measuring the distances between the ejecting portion and the plurality of portions separated mutually on the substrate.

6. A method of manufacturing an electron source, having a plurality of electron-emitting devices, comprising the steps of:

moving, relative to each other, a droplet ejecting portion of an ink jet device and a substrate, to which droplets are to be ejected, in a direction along a droplet-receiving surface of the substrate;

detecting a distance between the ejecting portion and the droplet-receiving surface of the substrate; and ejecting to a plurality of portions separated mutually on the substrate at plural times at a predetermined time interval the droplets of a liquid containing material for forming a conductive member of the electron-emitting devices, wherein the predetermined time interval is determined based on a result of the detecting, and wherein the detecting of the distance includes a step of measuring distances between the ejecting portion and some of the plurality of portions separated mutually on the substrate.

7. A method of manufacturing an electron source as claimed in claim 5 or 6, wherein the ink jet device is of a type that imparts thermal energy to the liquid to produce a bubble, thereby to eject a droplet.

8. A method of manufacturing an electron source as claimed in claim 5 or 6, wherein the ink jet device is of a type that ejects the droplets by means of a piezo-electric element.

9. A method of manufacturing an image forming apparatus having an electron source and an image forming member onto which electrons are irradiated from the electron source, wherein the electron source is one that has been manufactured by a method as claimed in claim 5 or 6.

10. A method of manufacturing an electronic device, comprising the steps of:

moving, relative to each other, a droplet ejecting portion of an ink jet device and a substrate, to which droplets are to be ejected, in a direction along a droplet-receiving surface of the substrate, while detecting a distance between the ejection portion and the droplet-receiving surface of the substrate; and ejecting toward a plurality of portions separated mutually on the substrate at plural times at a predetermined time interval the droplets of a liquid containing material for forming the electronic device, wherein the predetermined time interval is controlled based on a result of the detecting, and wherein the detecting of the distance includes a step of measuring distances between the ejecting portion and the plurality of portions separated mutually on the substrate.

11. A method of manufacturing an electronic device, comprising the steps of:

moving, relative to each other, a droplet ejecting portion of an ink jet device and a substrate, to which droplets are to be ejected, in a direction along a droplet-receiving surface of the substrate, while detecting a distance between the ejection portion and the droplet-receiving surface of the substrate; and ejecting toward a plurality of portions separated mutually on the substrate at plural times at a predetermined time interval the droplets of a liquid containing material for forming the electronic device, wherein the predetermined time interval is controlled based on a result of the detecting, and wherein the detecting of the distance includes a step of measuring distances between the ejecting portion and some of the plurality of portions separated mutually on the substrate.

12. A method of manufacturing an electron source, having a plurality of electron-emitting devices, comprising the steps of:

moving, relative to each other, a droplet ejection portion on an ink jet device and a substrate, to which droplets are to be ejected, in a direction along a droplet-receiving surface of the substrate, while detecting a distance between the ejection portion and the droplet-receiving surface of the substrate; and ejecting to a plurality of portions separated mutually on the substrate at plural times at a predetermined time interval the droplets of a liquid containing material for forming the electron-emitting devices, wherein the predetermined time interval is controlled based on a result of the detecting, and wherein the detecting of the distance includes a step of measuring the distances between the ejecting portion and the plurality of portions separated mutually on the substrate.

13. A method of manufacturing an electron source, having a plurality of electron-emitting devices, comprising the steps of:

moving, relative to each other, a droplet ejection portion on an ink jet device and a substrate, to which droplets are to be ejected, in a direction along a droplet-receiving surface of the substrate, while detecting a distance between the ejecting portion and the droplet-receiving surface of the substrate; and ejecting to a plurality of portions separated mutually on the substrate at plural times at a predetermined time interval the droplets of a liquid containing material for forming the electron-emitting devices, wherein the predetermined time interval is controlled based on a result of the detecting, and wherein the detecting of the distance includes a step of measuring distances between the ejecting portion and some of the plurality of portions separated mutually on the substrate.

14. A method of manufacturing an image forming apparatus having an electron source and an image forming member onto which electrons are irradiated from the electron source, wherein the electron source is manufactured by a method as claimed in claim 12 or 13.

15. A method of manufacturing an electronic device as claimed in claim 10 or 11, wherein the ink jet device ejects the droplets by applying thermal energy to the liquid to generate a bubble in the liquid.

16. A method of manufacturing an electronic device as claimed in claim 10 or 11, wherein the ink jet device ejects the droplets by means of a piezo-electric element.

17. A method of manufacturing an electron source as claimed in claim 12 or 13, wherein the ink jet device ejects the droplets by applying thermal energy to the liquid to generate a bubble in the liquid.

18. A method of manufacturing an electron source as claimed in claim 12 or 13, wherein the ink jet device ejects the droplets by means of a piezo-electric element.

* * * * *

UNITED STATES PATENT AND TRADEMARK OFFICE
CERTIFICATE OF CORRECTION

PATENT NO. : 6,815,001 B1
DATED : November 9, 2004
INVENTOR(S) : Seiji Mishima et al.

It is certified that error appears in the above-identified patent and that said Letters Patent is hereby corrected as shown below:

Title page,
Item [54], Title, "ELECTRONIC DEVICE, METHOD FOR PRODUCING ELECTRON SOURCE AND IMAGE FORMING DEVICE, AND APPARATUS FOR PRODUCING ELECTRONIC DEVICE" should read -- METHOD OF MANUFACTURING ELECTRONIC DEVICE, ELECTRONIC SOURCE AND IMAGE FORMING APPARATUS, AND DEVICE FOR MANUFACTURING THE ELECTONIC DEVICE --.

Column 2,
Line 45, "similarly" should read -- similar --; and
Line 56, "denote" should read -- denotes --.

Column 3,
Lines 38 and 47, "the" should be deleted.

Column 14,
Line 51, "gage not shown" should read -- guage, not shown, --.

Column 19,
Line 45, "refection" should read -- reflection --.

Column 20,
Line 54, "O [V]" should read -- 0 [V] --.

Column 23,
Line 26, "that" should be deleted.

Column 34,
Line 19, "o" should read -- to --.

Column 35,
Line 26, "advantageous" should read -- advantages --.

UNITED STATES PATENT AND TRADEMARK OFFICE
CERTIFICATE OF CORRECTION

PATENT NO. : 6,815,001 B1
DATED : November 9, 2004
INVENTOR(S) : Seiji Mishima et al.

It is certified that error appears in the above-identified patent and that said Letters Patent is hereby corrected as shown below:

Column 36,
Line 20, "o" should read -- to --.

Signed and Sealed this

Thirty-first Day of May, 2005

JON W. DUDAS
*Director of the United States Patent and Trademark Office*